(12) United States Patent
Hwang et al.

(10) Patent No.: US 12,543,415 B2
(45) Date of Patent: Feb. 3, 2026

(54) LIGHT EMITTING DIODE AND DISPLAY DEVICE COMPRISING THE SAME

(71) Applicant: LG ELECTRONICS INC., Seoul (KR)

(72) Inventors: Sunghyun Hwang, Seoul (KR); Mihee Heo, Seoul (KR); Kiseong Jeon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 459 days.

(21) Appl. No.: 18/035,710

(22) PCT Filed: Nov. 6, 2020

(86) PCT No.: PCT/KR2020/015468
§ 371 (c)(1),
(2) Date: May 5, 2023

(87) PCT Pub. No.: WO2022/097785
PCT Pub. Date: May 12, 2022

(65) Prior Publication Data
US 2023/0395762 A1    Dec. 7, 2023

(51) Int. Cl.
*H10H 20/832* (2025.01)
*H10H 20/816* (2025.01)
(Continued)

(52) U.S. Cl.
CPC ...... *H10H 20/832* (2025.01); *H10H 20/8312* (2025.01); *H10H 20/8316* (2025.01);
(Continued)

(58) Field of Classification Search
CPC ..... H10H 20/83–8312; H10H 20/8316; H10H 20/832; H10H 20/816; H01L 2224/95144
See application file for complete search history.

(56) References Cited

U.S. PATENT DOCUMENTS

2009/0305448 A1    12/2009  Shakuda
2017/0148771 A1    5/2017   Cha et al.
(Continued)

FOREIGN PATENT DOCUMENTS

CN    110459660 A    11/2019
EP    3 731 275 A1   10/2020
(Continued)

*Primary Examiner* — Christine S. Kim
*Assistant Examiner* — Tyler J Wiegand
(74) *Attorney, Agent, or Firm* — Birch, Stewart, Kolasch & Birch, LLP

(57) ABSTRACT

A light emitting device includes a first conductivity-type semiconductor layer, an active layer on the first conductivity-type semiconductor layer, a second conductivity-type semiconductor layer on the active layer, a first electrode on the first conductivity-type semiconductor layer, a second electrode on the second conductivity-type semiconductor layer, and a diffusion layer between the first electrode and the first conductivity-type semiconductor layer. The first electrode includes a plurality of layers, and at least one layer of the plurality of layers includes a magnetic material. The diffusion layer includes a magnetic material, and a thickness of the diffusion layer is 100 nm or less.

19 Claims, 14 Drawing Sheets

(51) Int. Cl.
*H10H 20/831* (2025.01)
*H10H 20/01* (2025.01)

(52) U.S. Cl.
CPC .............. *H01L 2224/95085* (2013.01); *H01L 2224/95144* (2013.01); *H10H 20/01* (2025.01); *H10H 20/816* (2025.01)

(56) References Cited

U.S. PATENT DOCUMENTS

| | | |
|---|---|---|
| 2019/0326477 A1 | 10/2019 | Kim et al. |
| 2021/0043798 A1 | 2/2021 | Zhang et al. |
| 2021/0202799 A1* | 7/2021 | Ge ................... H10H 20/857 |
| 2022/0302347 A1 | 9/2022 | Kim et al. |
| 2024/0030386 A1* | 1/2024 | Momose ............. H10H 20/825 |

FOREIGN PATENT DOCUMENTS

| | | |
|---|---|---|
| JP | 2020-155428 A | 9/2020 |
| KR | 10-1617959 B1 | 5/2016 |
| KR | 10-2017-0059068 A | 5/2017 |
| KR | 10-2020-0046816 A | 5/2020 |
| KR | 10-2145193 B1 | 8/2020 |
| WO | WO 2019/017924 A1 | 1/2019 |

* cited by examiner

[FIG. 1]
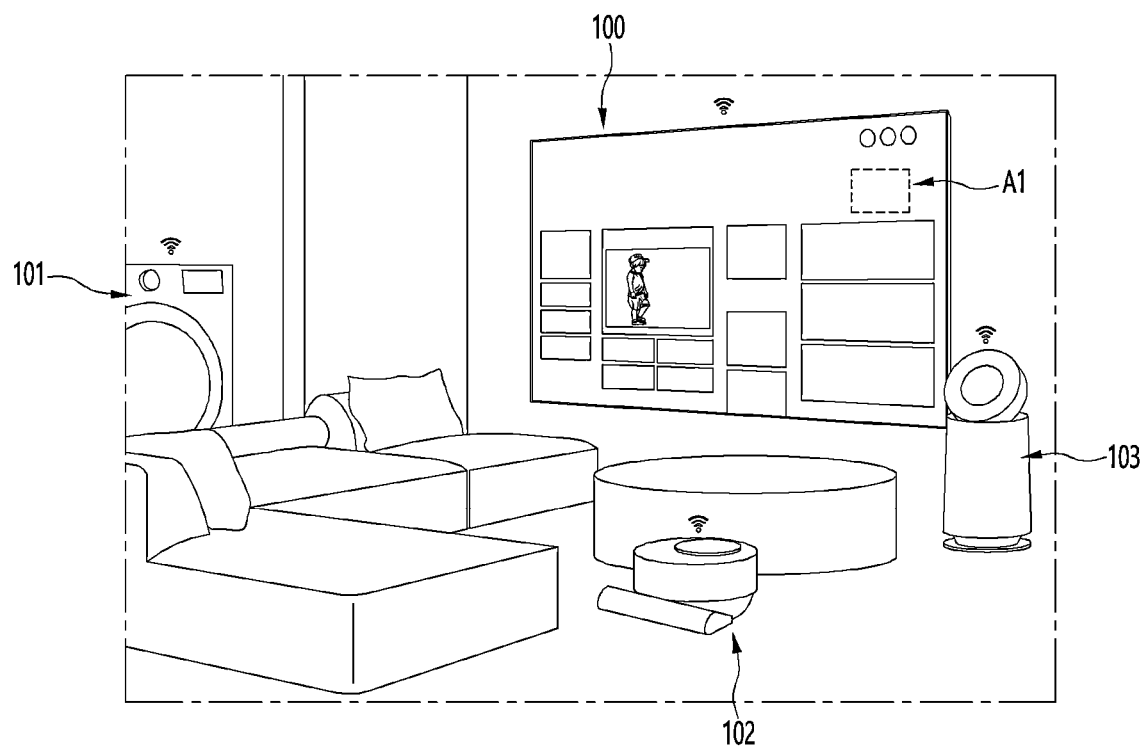

[FIG. 2]
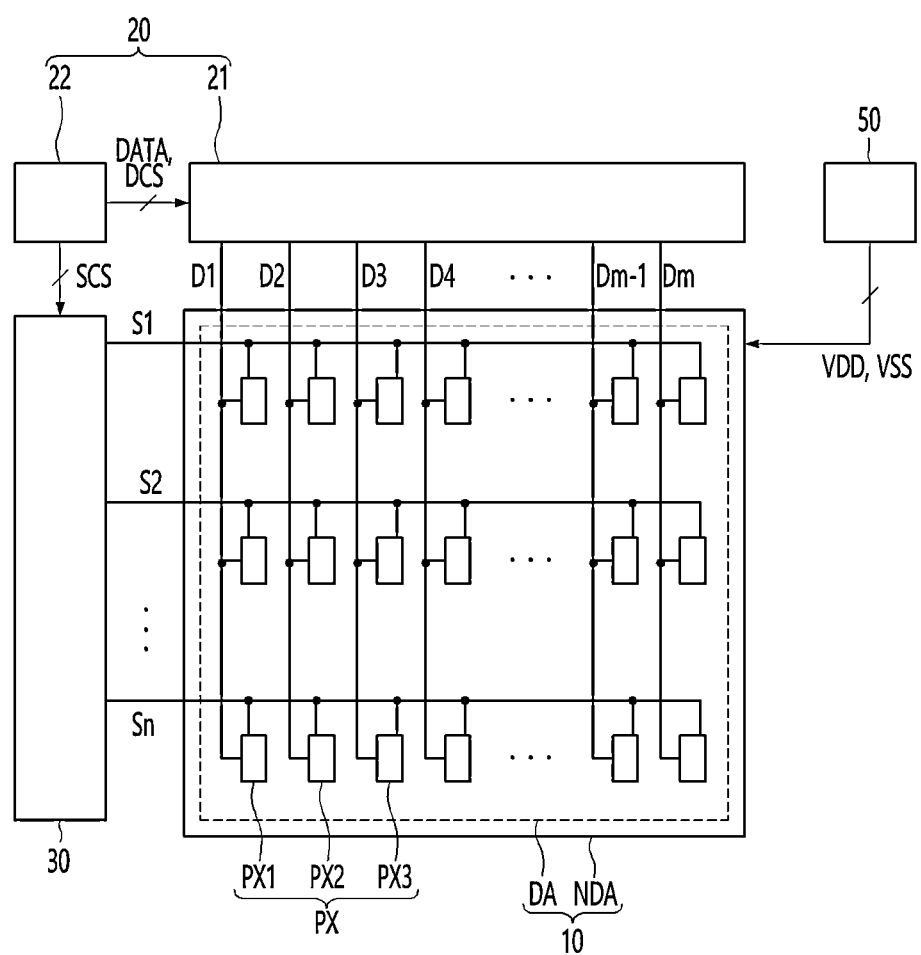

[FIG. 3]
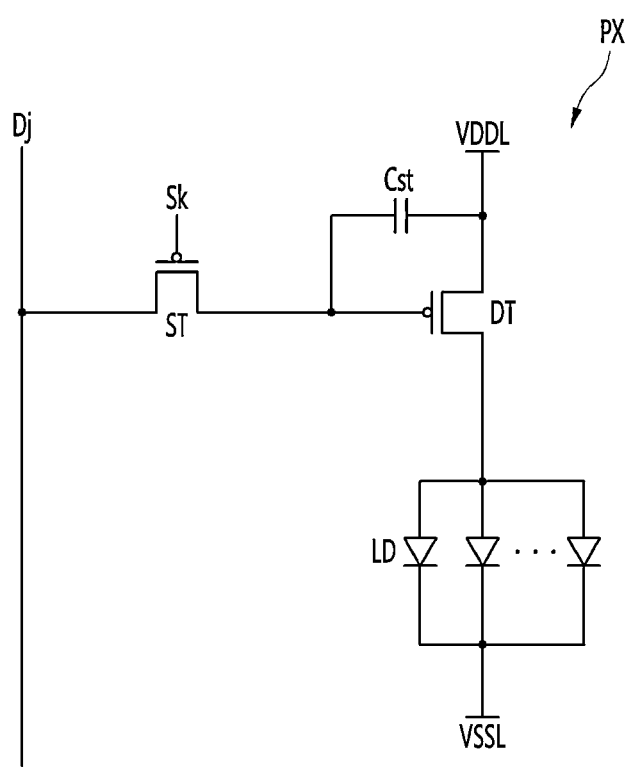

[FIG. 4]
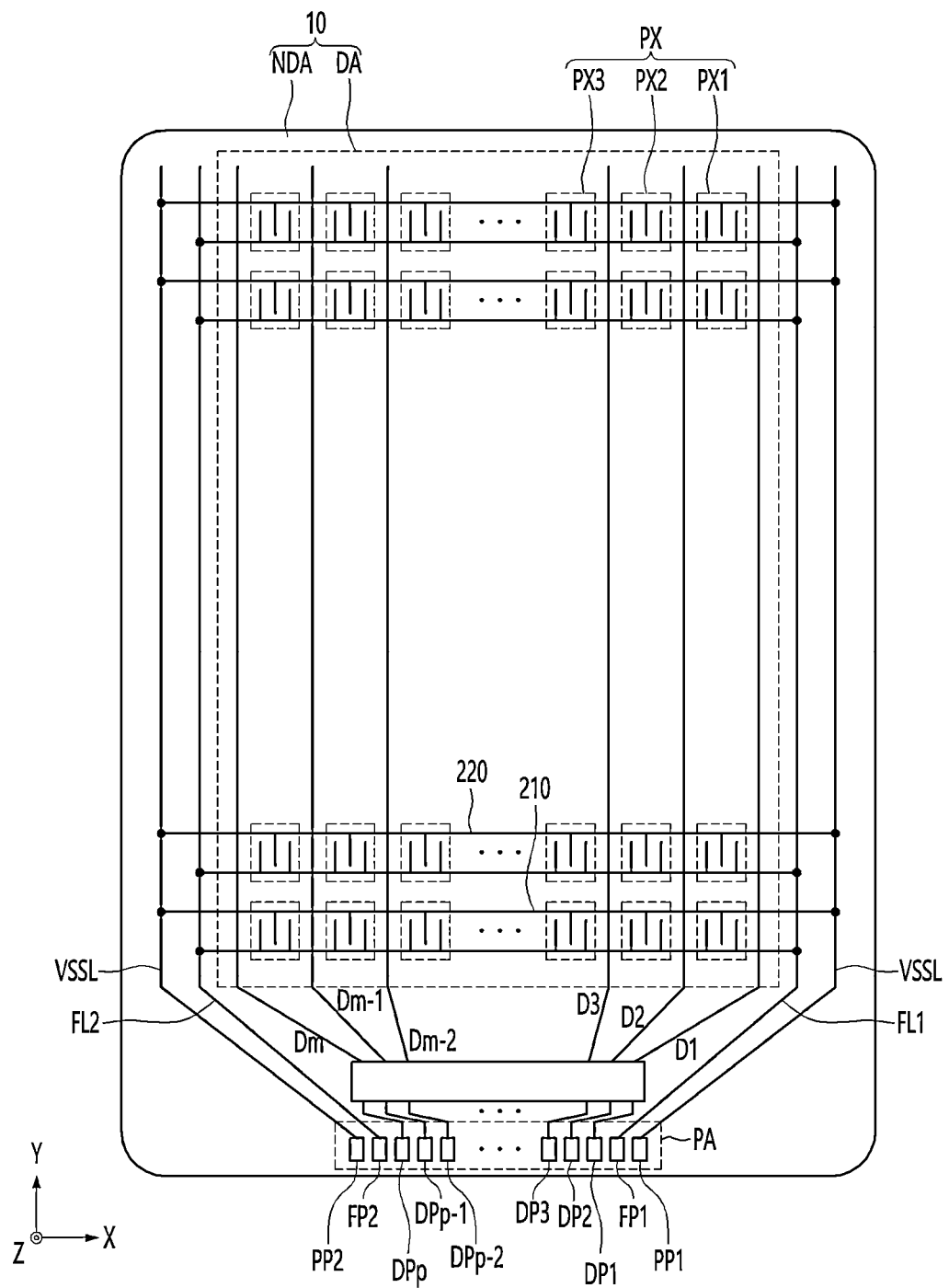

[FIG. 5]
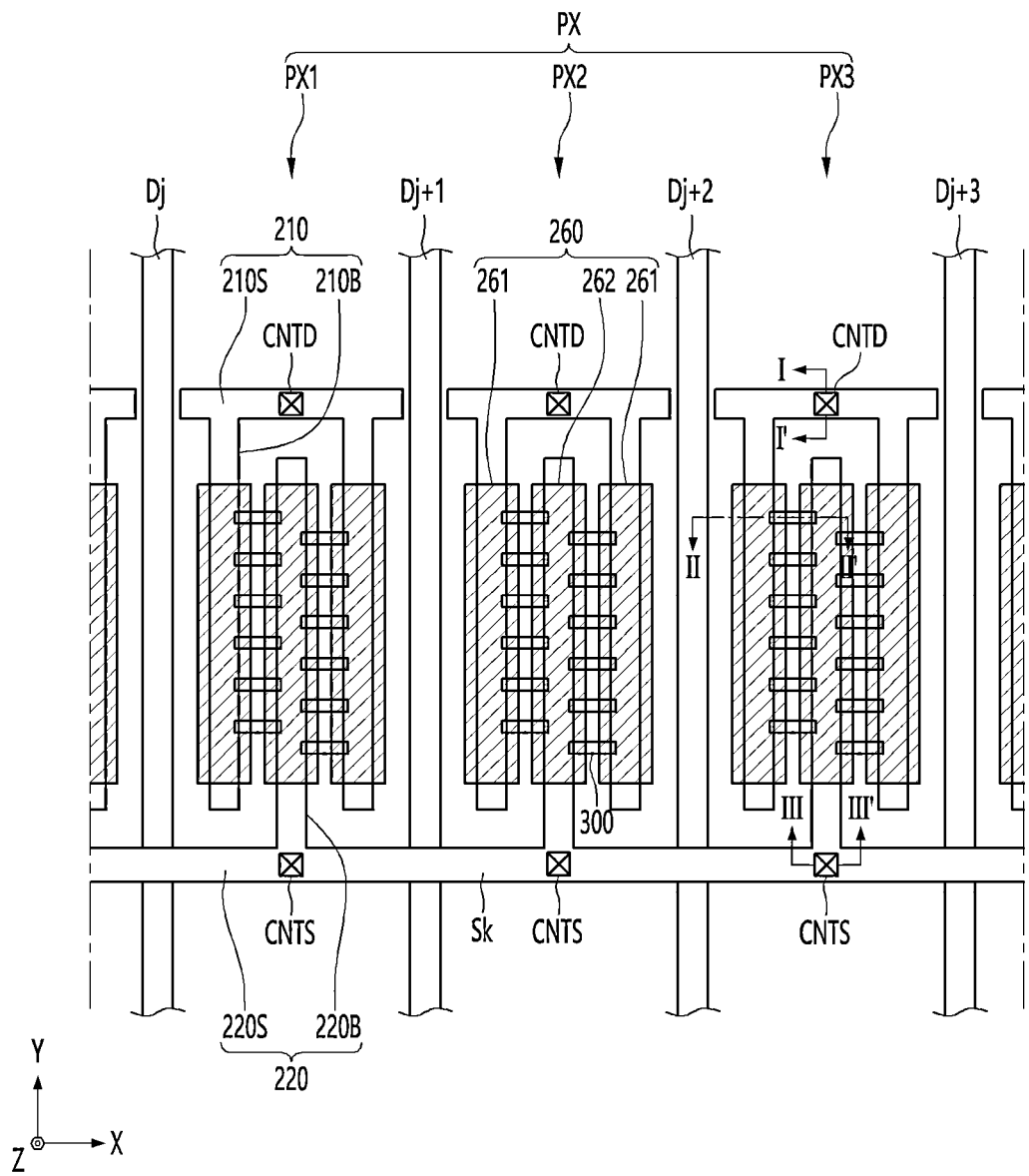

[FIG. 6]
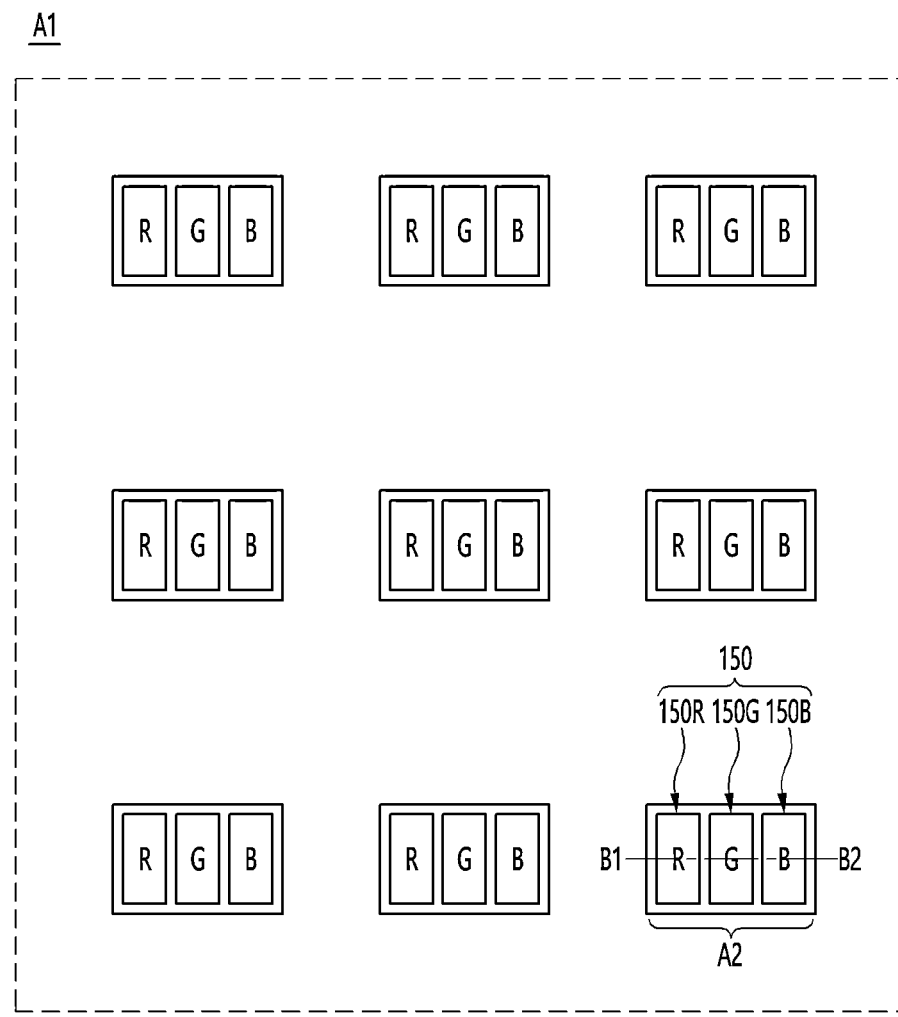

[FIG. 7]
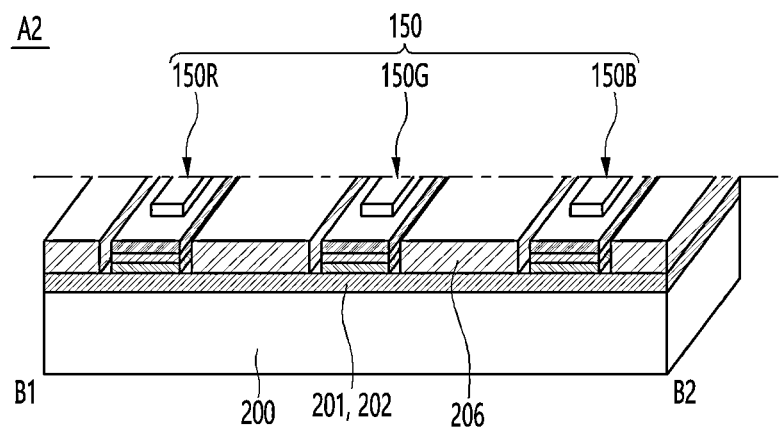
[FIG. 8]
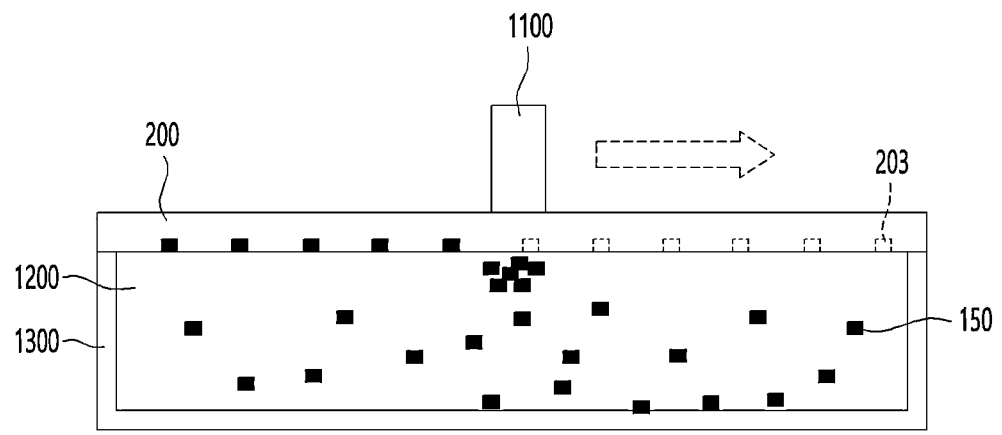

[FIG. 9]
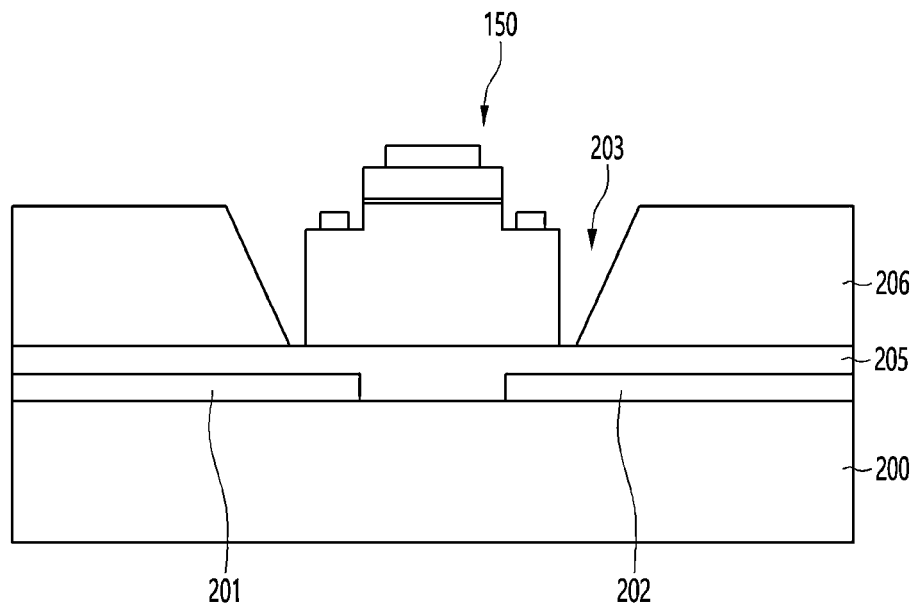
[FIG. 10]
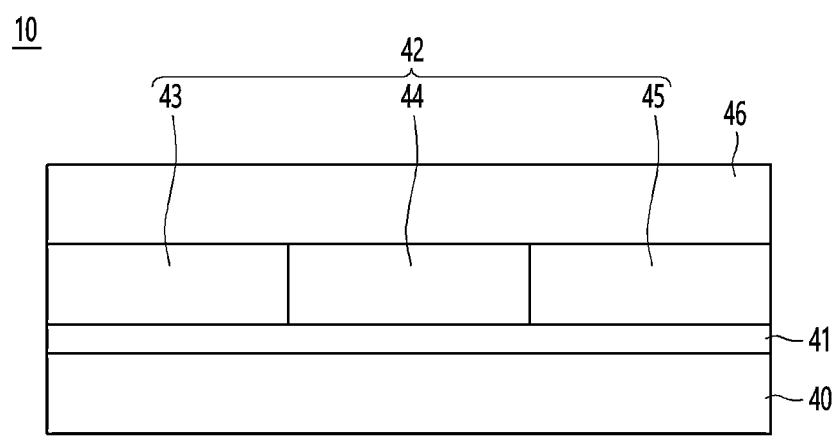

[FIG. 11]
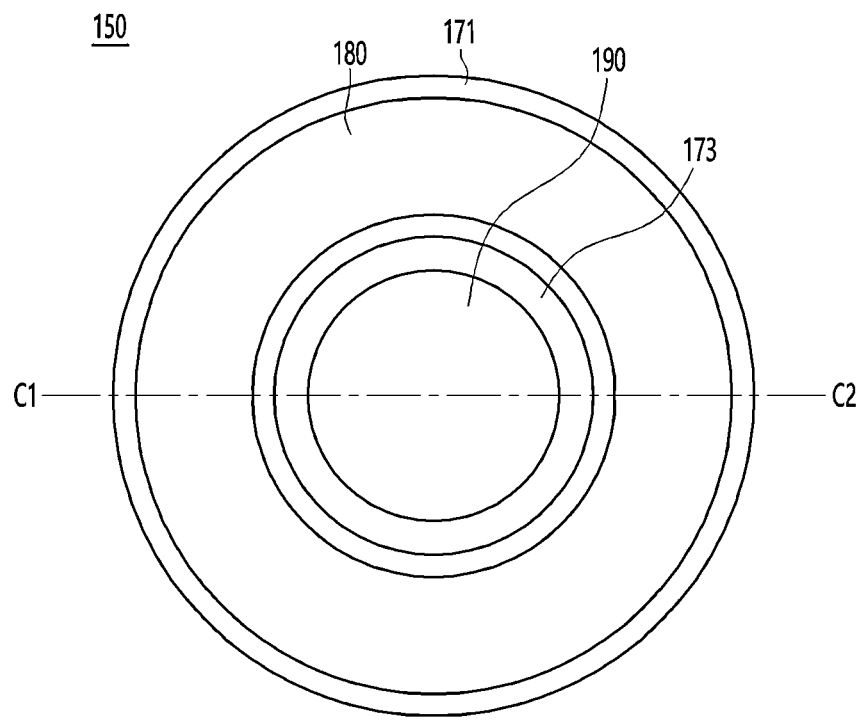
[FIG. 12]
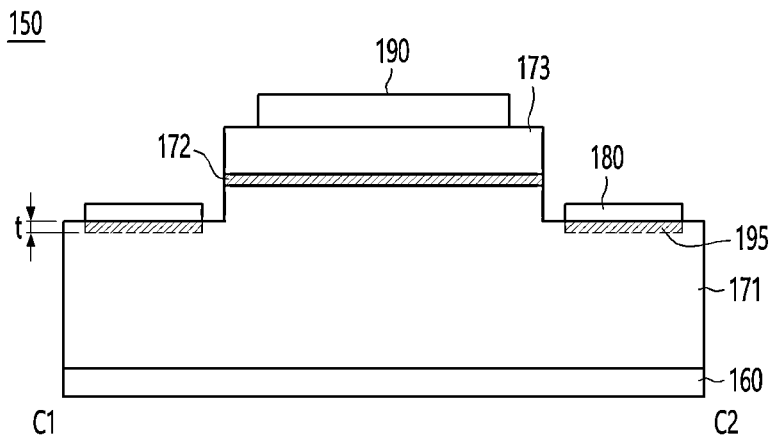

[FIG. 13]
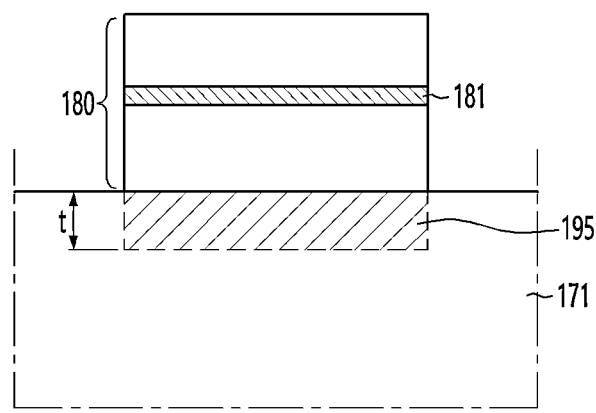
[FIG. 14]
180A
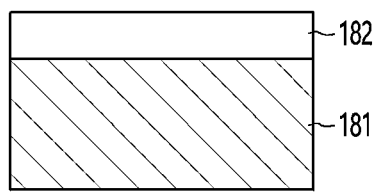
[FIG. 15]
180B
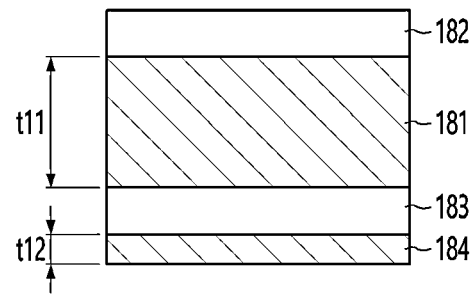

[FIG. 16]
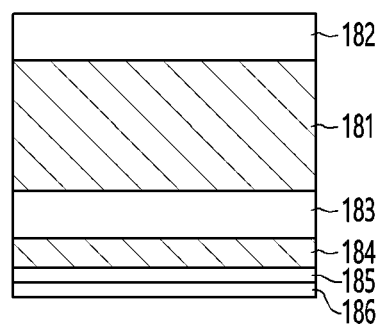

[FIG. 17]
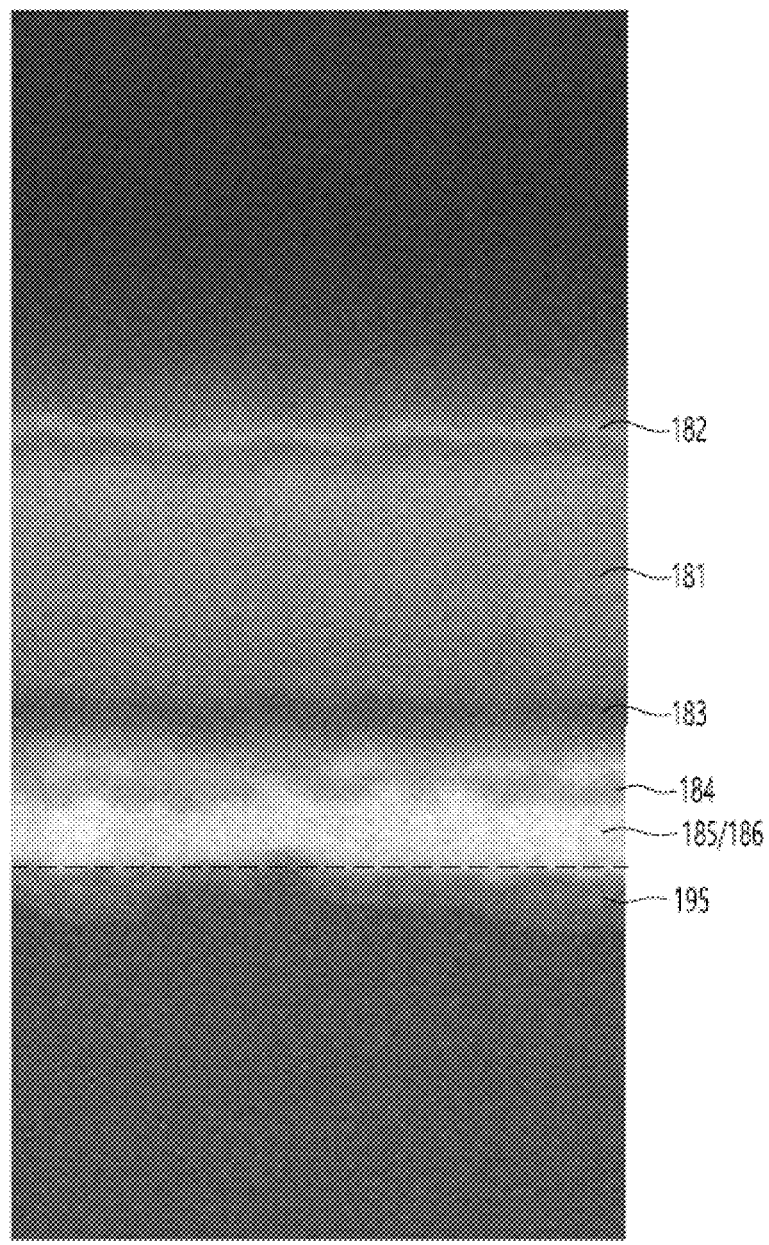

[FIG. 18]
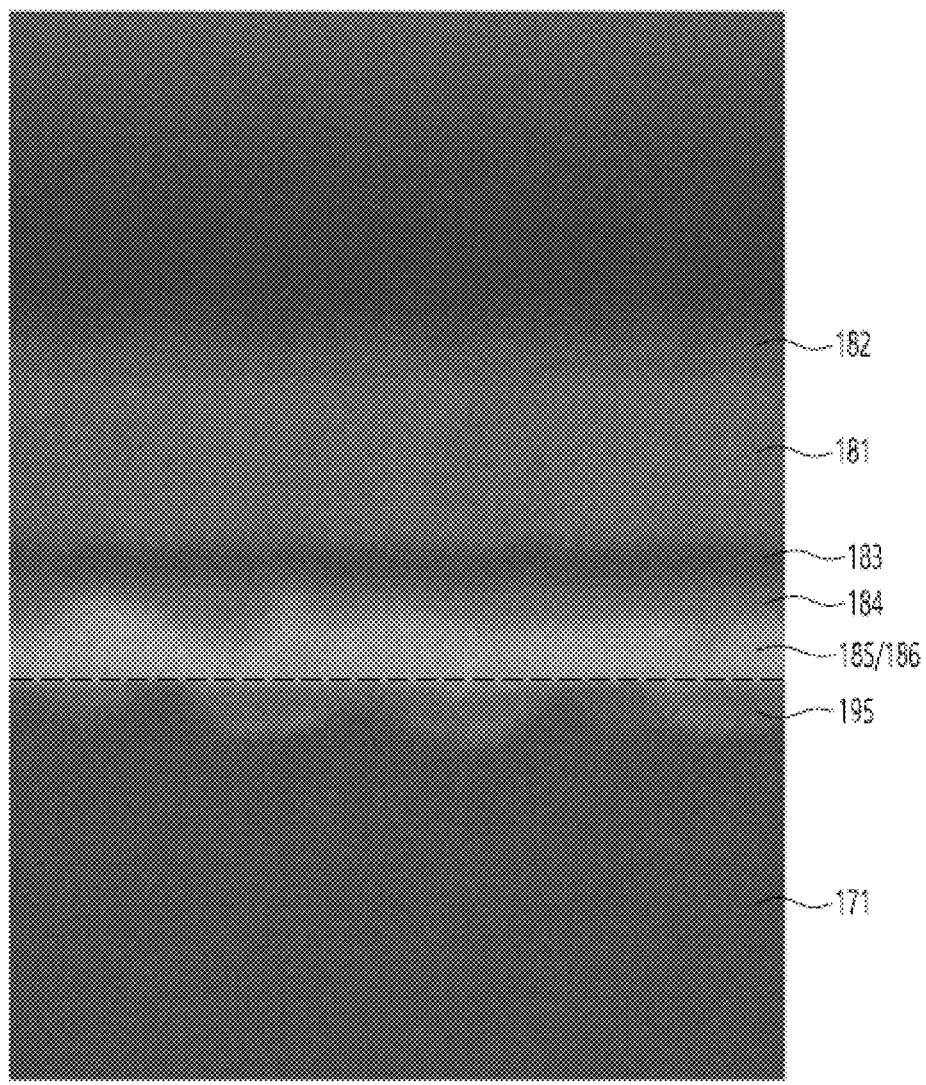

[FIG. 19]
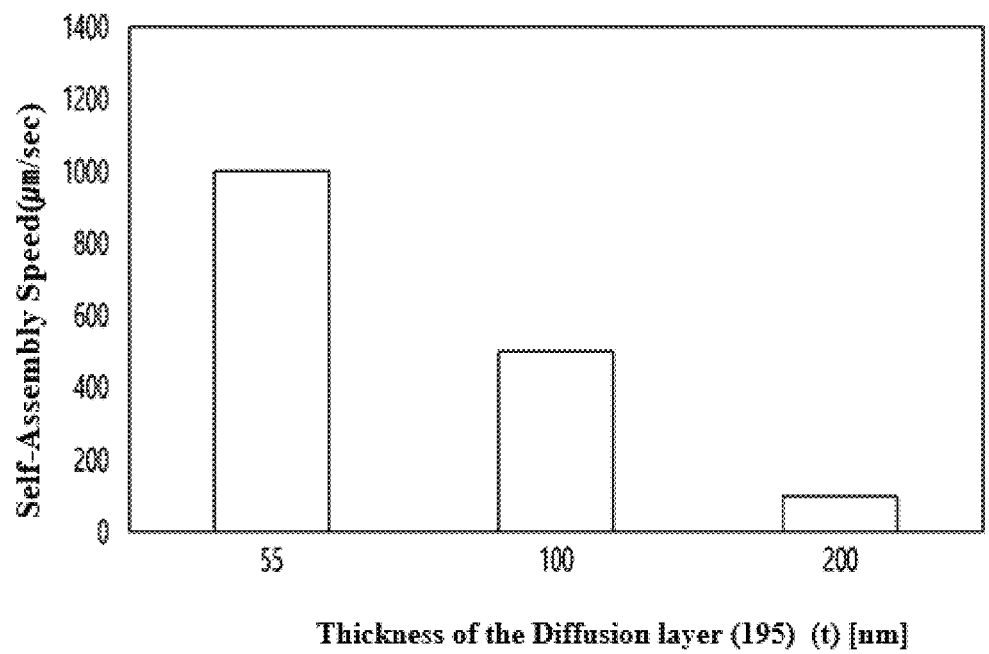

LIGHT EMITTING DIODE AND DISPLAY DEVICE COMPRISING THE SAME

CROSS REFERENCE TO RELATED APPLICATIONS

This application is the National Phase of PCT/KR2020/015468 filed on Nov. 6, 2020, which is hereby expressly incorporated by reference into the present application.

TECHNICAL FIELD

Embodiment relates to a light emitting device and a display device including the same.

BACKGROUND ART

A display device uses a self-light emitting device such as a light emitting diode as a light source of a pixel to display a high-definition image. Light emitting diodes exhibit excellent durability even under harsh environmental conditions, and are in the limelight as a light source for next-generation display devices because of their long lifespan and high luminance.

Recently, research is being conducted to manufacture a subminiature light emitting diode using a material having a highly reliable inorganic crystal structure and to use it as a next-generation pixel light source by placing it on a panel of a display device (hereinafter referred to as "display panel").

In order to implement high resolution, the size of pixels is gradually getting smaller, and since a large number of light emitting devices should be aligned in such small-sized pixels, research into the manufacture of ultra-small light emitting diodes as small as micro or nano scale is being actively conducted.

A typical display panel includes millions of pixels. Therefore, since it is very difficult to align light emitting devices in each of millions of small-sized pixels, various studies on arranging light emitting devices in a display panel are being actively conducted.

In general, ohmic characteristics between a semiconductor layer containing an n-type dopant and an electrode in a light emitting device are not good, so an ohmic contact layer is formed between the semiconductor layer and the electrode. Typically, an ohmic contact layer is formed by a reaction between a material of a semiconductor layer and a material of an electrode through a heat treatment process.

On the other hand, as the size of light emitting devices decreases, transferring these light emitting devices onto a substrate has emerged as a very important problem. Transfer technologies that have recently been developed include a pick and place process, a laser lift-off method, or a self-assembly method. In particular, a self-assembly method in which a light emitting device is transferred onto a substrate using a magnetic material has recently been in the limelight. A magnetic material is included in the light emitting device for self-assembly.

However, as described above, when the heat treatment process is performed to form the ohmic contact layer, since most of the magnetic material of the electrode is used to form an ohmic contact layer, the light emitting device is not pulled by the magnetic material during self-assembly, so the light emitting device is not aligned on the substrate or the electrode is not magnetized and is not pulled by the magnetic material. Accordingly, there is a problem in that the movement speed of the light emitting device is lowered and the self-assembly speed is also significantly lowered.

In addition, when the thickness of the ohmic contact layer is increased, defects such as sticking between light emitting devices or lifting of electrodes occur during self-assembly.

On the other hand, as the size of the light emitting device decreases, the light efficiency of each light emitting devices should be improved in order to implement a desired luminance per unit pixel. However, there is a limit to improving light efficiency with the structure of a conventional light emitting device.

DISCLOSURE

Technical Problem

Embodiment is aimed at solving the foregoing and other problems.

Another object of the embodiment is to provide a light emitting device capable of dramatically improving a self-assembly speed and a display device including the same.

Another object of the embodiment is to provide a light emitting device capable of securing high luminance by improving light efficiency and a display device including the light emitting device.

Another object of the embodiment is to provide a light emitting device capable of improving ohmic characteristics and a display device including the same.

Technical Solution

According to one aspect of the embodiment, the light emitting device includes a first conductivity-type semiconductor layer; an active layer on the first conductivity-type semiconductor layer; a second conductivity-type semiconductor layer on the active layer; a first electrode on the first conductivity-type semiconductor layer; a second electrode on the second conductivity-type semiconductor layer; and a diffusion layer between the first electrode and the first conductivity-type semiconductor layer. The first electrode includes a plurality of layers. At least one layer among the plurality of layers includes a magnetic material. The diffusion layer includes the magnetic material. The thickness of the diffusion layer can be 100 nm or less. With this configuration of the light emitting device, ohmic characteristics can be improved.

According to another aspect of the embodiment, the display device includes a substrate; first and second wire electrodes on the substrate; a partition layer having a plurality of assembly holes and on the first and second wire electrodes; and a light emitting device disposed in each of the plurality of assembly holes. The light emitting device includes a first conductivity-type semiconductor layer; an active layer on the first conductivity-type semiconductor layer; a second conductivity-type semiconductor layer on the active layer; a first electrode on the first conductivity-type semiconductor layer; a second electrode on the second conductivity-type semiconductor layer; and a diffusion layer between the first electrode and the first conductivity-type semiconductor layer. The first electrode includes a plurality of layers. At least one layer among the plurality of layers includes a magnetic material. The diffusion layer includes the magnetic material. The thickness of the diffusion layer can be 100 nm or less. With this configuration of the display device, the self-assembly speed can be significantly improved, high brightness can be secured, defects can be eliminated, and manufacturing cost can be reduced to secure price competitiveness for the product.

Effects of the Invention

Effects of the light emitting device and the display device including the light emitting device according to the embodiment are described as follows.

According to at least one of the embodiments, by changing the electrode structure mechanism so that the depth of the diffusion layer is 100 μm or less, the ohmic characteristics of the diffusion layer can be improved, also the self-assembly speed can be dramatically improved. Also, when self-assembly using a magnetic material, luminance deterioration can be prevented and high luminance can be secured.

For example, by increasing the thickness of the first layer of the first electrode in contact with the first conductivity-type semiconductor layer to 150 nm to 200 nm, and a portion of Ni in the first layer can be diffused into the first conductivity-type semiconductor layer, the diffusion layer can have a thickness of 100 nm or less.

For example, the first layer and the fourth layer of the first electrode in contact with the first conductivity-type semiconductor layer can include Ni, and the third layer disposed between the first layer and the fourth layer can include Ti, the first layer can be magnetized during self-assembly and used as an assembly inducing layer that allows the light emitting device to be inserted into the substrate, and the fourth layer can be used as a diffusion contributing layer to form a diffusion layer having a thickness of 100 nm or less by diffusion of Ni of the fourth layer into the first conductivity-type semiconductor layer during the heat treatment process.

For example, a third layer can be disposed between the first layer and the fourth layer of the first electrode in contact with the first conductivity-type semiconductor layer, a fifth layer can be disposed under the fourth layer, wherein the first layer and the fourth layer can include Ni, the fourth layer can include Ti, and the fifth layer can include Au. In this case, the fifth layer can be used as a diffusion suppressing layer for suppressing, alleviating, or hindering Ni of the fourth layer from rapidly accelerating and diffusing into the first conductivity-type semiconductor layer. Due to the fifth layer, Ni of the fourth layer is abrupt and is not diffused into the first conductivity-type semiconductor layer, so that the diffusion layer can have a thickness of 100 nm or less.

As shown in FIG. 19, since the thickness of the diffusion layer can be formed to be less than 100 nm and the amount of Ni is completely preserved in the specific layer including Ni in the first electrode, the self-assembly speed can be dramatically improved compared to the comparative example.

According to at least one of the embodiments, the light emitting device of the embodiment has a mesa structure, and the first conductivity-type semiconductor layer, the active layer, and the second conductivity-type semiconductor layer can have a circular shape, the first electrode disposed on the first conductivity-type semiconductor layer can have a closed loop shape surrounding the second electrode. Accordingly, since current can flow uniformly from the second electrode to the first electrode along the radial direction via the second conductivity-type semiconductor layer, the active layer, and the first conductivity-type semiconductor layer, electrons in the entire region of the first conductivity-type semiconductor layer can be injected into the active layer and can contribute to light emission, so light emitting efficiency can be improved.

According to at least one of the embodiments, since the first electrode has a closed loop shape, the diffusion layer corresponding to the first electrode can also have a closed loop shape. Since current can easily flow from the first conductivity-type semiconductor layer through the diffusion layer and the first electrode having a closed loop shape, light efficiency can be improved.

A further scope of applicability of the embodiment will become apparent from the detailed description below. However, since various changes and modifications within the spirit and scope of the embodiments can be clearly understood by those skilled in the art, it should be understood that the detailed description and specific embodiments, such as preferred embodiments, are given by way of example only.

DESCRIPTION OF DRAWINGS

FIG. 1 shows a living room of a house in which a display device 100 according to an embodiment is disposed.

FIG. 2 is a block diagram schematically showing a display device according to an exemplary embodiment.

FIG. 3 is a circuit diagram showing an example of a pixel of FIG. 2.

FIG. 4 is a plan view showing the display panel of FIG. 2 in detail.

FIG. 5 is a plan view showing pixels in the display area of FIG. 4 in detail.

FIG. 6 is an enlarged view of a first panel area in the display device of FIG. 1.

FIG. 7 is an enlarged view of area A2 of FIG. 6.

FIG. 8 is a view showing an example in which a light emitting device according to an embodiment is assembled to a substrate by a self-assembly method.

FIG. 9 shows a state in which a light emitting device is inserted into a substrate by the self-assembly method shown in FIG. 8.

FIG. 10 is a schematic cross-sectional view of the display panel of FIG. 2.

FIG. 11 is a plan view illustrating a light emitting device according to an embodiment.

FIG. 12 is a cross-sectional view illustrating a light emitting device according to an embodiment.

FIG. 13 is an enlarged view of the first electrode and its surroundings.

FIG. 14 shows a first example of the first electrode of the embodiment.

FIG. 15 shows a second example of the first electrode of the embodiment.

FIG. 16 shows a third example of the first electrode of the embodiment.

FIG. 17 is an image showing a first example of the first electrode and the diffusion layer.

FIG. 18 is an image showing a second example of the first electrode and the diffusion layer.

FIG. 19 shows the self-assembly speed according to the thickness of the diffusion layer.

MODE FOR INVENTION

Hereinafter, the embodiments disclosed in the present specification will be described in detail with reference to the accompanying drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. Also, the accompanying drawings are for easy understanding of the embodiments disclosed in the present specification, and the technical spirit disclosed in the present specification is not limited by the accompanying drawings. Also, when an element, such as a layer, area, or substrate, is referred to as being 'on' another component, this includes that it is directly on the other element or there can be other intermediate elements in between.

The display device described in this specification can include a mobile phone, a smart phone, a laptop computer, a Digital broadcasting terminal, a personal digital assistant (PDA), a portable multimedia player (PMP), a navigation, a slate PC, a tablet PC, an ultra-book, a digital TV, a desktop computer, etc. However, the configuration according to the embodiment described in the present specification can be applied to a device capable of displaying even a new product form to be developed later.

Hereinafter, a light emitting device according to an embodiment and a display device including the light emitting device will be described.

FIG. 1 shows a living room of a house in which a display device 100 according to an embodiment is disposed.

The display device 100 of the embodiment can display the status of various electronic products such as the washing machine 10, the robot cleaner 20, and the air purifier 30 and can communicate with each electronic product based on IOT and can control each electronic product based on user's setting data.

The display device 100 according to the embodiment can include a flexible display fabricated on a thin and flexible substrate. The flexible display can be bent or rolled like paper while maintaining characteristics of a conventional flat panel display.

In the flexible display, visual information can be implemented by independently controlling light emission of unit pixels arranged in a matrix form. The unit pixel means a minimum unit for implementing one color. A unit pixel of the flexible display can be implemented by a semiconductor light emitting device. In the embodiment, the semiconductor light emitting device can be a Micro-LED, but is not limited thereto.

FIG. 2 is a block diagram schematically illustrating a display device according to an exemplary embodiment, and FIG. 3 is a circuit diagram illustrating an example of a pixel of FIG. 2.

Referring to FIGS. 2 and 3, the display device according to the embodiment can include a display panel 10, a driving circuit 20, a scan driving unit 30, and a power supply circuit 50.

Specifically, the display device 100 can drive a clock in an active matrix (AM) method or a passive matrix (PM) method.

The driving circuit 20 can include a data driver 21 and a timing controller 22.

The display panel 10 can have a rectangular shape on a plane. The planar shape of the display panel 10 is not limited to a rectangle, and can be formed into other polygonal, circular or elliptical shapes. At least one side of the display panel 10 can be formed to be bent with a predetermined curvature.

The display panel 10 can be divided into a display area DA and a non-display area NDA disposed around the display area DA. The display area DA is an area in which pixels PX are formed to display an image. The display panel 10 can include data lines (D1 to Dm, m is an integer greater than or equal to 2), scan lines crossing the data lines D1 to Dm (S1 to Sn, n is an integer greater than or equal to 2), the high-potential voltage line VDDL supplied with the high-voltage, the low-potential voltage line VSSL supplied with the low-potential voltage, and the pixels PX connected to the data lines D1 to Dm and the scan lines S1 to Sn can be included.

Each of the pixels PX can include a first sub-pixel PX1, a second sub-pixel PX2, and a third sub-pixel PX3. The first sub-pixel PX1 can emit a first color light, the second sub-pixel PX2 can emit a second color light, and the third sub-pixel PX3 can emit a third color light. The first color light can be red light, the second color light can be green light, and the third color light can be blue light, but is not limited thereto. Also, although it is illustrated that each of the pixels PX can include three sub-pixels in FIG. 2, the present invention is not limited thereto. That is, each of the pixels PX can include four or more sub-pixels.

Each of the first sub-pixel PX1, the second sub-pixel PX2, and the third sub-pixel PX3 can connected to at least one of the data lines D1 to Dm, and at least one of the scan lines S1 to Sn, and a high potential voltage line VDDL. As shown in FIG. 3, the first sub-pixel PX1 can include the light emitting devices LD, plurality of transistors for supplying current to the light emitting devices LD, and at least one capacitor.

Each of the light emitting devices LD can be an inorganic light emitting diode including a first electrode, an inorganic semiconductor, and a second electrode. Here, the first electrode can be an anode electrode, and the second electrode can be a cathode electrode.

The plurality of transistors as shown in FIG. 3 can include a driving transistor DT for supplying current to the light emitting devices LD, and a scan transistor ST for supplying a data voltage to the gate electrode of the driving transistor DT. The driving transistor DT can include a gate electrode connected to the source electrode of the scan transistor ST, a source electrode connected to a high potential voltage line VDDL to which a high potential voltage is applied, and a drain electrode connected to first electrodes of the light emitting devices LD. The scan transistor ST can include a gate electrode connected to the scan line Sk, where k is an integer satisfying $1 \leq k \leq n$, a source electrode connected to the gate electrode of the driving transistor DT, and a drain electrode connected to data lines Dj, where j is integer satisfying $1 \leq j \leq m$.

The capacitor Cst is formed between the gate electrode and the source electrode of the driving transistor DT. The storage capacitor Cst stores a difference voltage between the gate voltage and the source voltage of the driving transistor DT.

The driving transistor DT and the scan transistor ST can be formed of a thin film transistor. Also, although the driving transistor DT and the scan transistor ST have been mainly described in FIG. 3 as being formed of a P-type MOSFET (Metal Oxide Semiconductor Field Effect Transistor), the present invention is not limited thereto. The driving transistor DT and the scan transistor ST can be formed of an N-type MOSFET. In this case, the positions of the source electrode and the drain electrode of each of the driving transistor DT and the scan transistor ST can be changed.

Also, in FIG. 3 has been illustrated each of the first sub-pixel PX1, the second sub-pixel PX2, and the third sub-pixel PX3 can include one driving transistor DT, one scan transistor ST, and 2T1C (2 Transistor-1 capacitor) having a capacitor Cst, but the present invention is not limited thereto. Each of the first sub-pixel PX1, the second sub-pixel PX2, and the third sub-pixel PX3 can include a plurality of scan transistors ST and a plurality of capacitors Cst.

Since the second sub-pixel PX2 and the third sub-pixel PX3 can be expressed with substantially the same circuit diagram as the first sub-pixel PX1, a detailed description thereof will be omitted.

The driving circuit 20 outputs signals and voltages for driving the display panel 10. To this end, the driving circuit 20 can include a data driver 21 and a timing controller 22.

The data driver 21 receives digital video data DATA and a source control signal DCS from the timing controller 22. The data driver 21 converts the digital video data DATA into analog data voltages according to the source control signal DCS and supplies them to the data lines D1 to Dm of the display panel 10.

The timing controller 22 receives digital video data DATA and timing signals from the host system. The timing signals can include a vertical sync signal, a horizontal sync signal, a data enable signal, and a dot clock. The host system can be an application processor of a smartphone or tablet PC, a monitor, or a system-on-chip of a TV.

The timing controller 22 generates control signals for controlling operation timings of the data driver 21 and the scan driver 30. The control signals can include a source control signal DCS for controlling the operation timing of the data driver 21 and a scan control signal SCS for controlling the operation timing of the scan driver 30.

The driving circuit 20 can be disposed in the non-display area NDA provided on one side of the display panel 10. The driving circuit 20 can be formed of an integrated circuit (IC) and mounted on the display panel 10 using a chip on glass (COG) method, a chip on plastic (COP) method, or an ultrasonic bonding method, but the present invention is not limited to this. For example, the driving circuit 20 can be mounted on a circuit board (not shown) instead of the display panel 10.

The data driver 21 is mounted on the display panel 10 using a chip on glass (COG) method, a chip on plastic (COP) method, or an ultrasonic bonding method, and the timing controller 22 can be mounted on a circuit board.

The scan driver 30 receives the scan control signal SCS from the timing controller 22. The scan driver 30 generates scan signals according to the scan control signal SCS and supplies them to the scan lines S1 to Sn of the display panel 10. The scan driver 30 can include a plurality of transistors and can be formed in the non-display area NDA of the display panel 10. Also, the scan driver 30 can be formed of an integrated circuit, and in this case, can be mounted on a gate flexible film attached to the other side of the display panel 10.

The circuit board can be attached to pads provided on one edge of the display panel 10 using an anisotropic conductive film. Due to this, the lead lines of the circuit board can be electrically connected to the pads. The circuit board can be a flexible printed circuit board, a printed circuit board, or a flexible film such as a chip on film. The circuit board can be bent under the display panel 10. Accordingly, one side of the circuit board can be attached to one edge of the display panel 10 and the other side can be disposed below the display panel 10 and connected to a system board on which a host system is mounted.

The power supply circuit 50 can generate voltages necessary for driving the display panel 10 from the main power applied from the system board and supply them to the display panel 10. For example, the power supply circuit 50 generates a high potential voltage VDD and a low potential voltage VSS for driving the light emitting devices LD of the display panel 10 from the main power supply, and can supply the high potential voltage line VDDL and the low potential voltage line VSSL of the display panel 10. Also, the power supply circuit 50 can generate and supply driving voltages for driving the driving circuit 20 and the scan driving unit 30 from the main power.

FIG. 4 is a plan view showing the display panel of FIG. 2 in detail. In FIG. 4, only data pads (DP1 to DPp, where p is an integer equal to or greater than 2), floating pads FD1 and FD2, power pads PP1 and PP2, floating lines FL1 and FL2, low potential voltage line VSSL, data lines D1 to Dm, first pad electrodes 210 and second pad electrodes 220 are shown for convenience of description.

Referring to FIG. 4, data lines D1 to Dm, first pad electrodes 210, second pad electrodes 220, and pixels PX can be disposed in the display area DA of the display panel 10.

The data lines D1 to Dm can extend long in the second direction (Y-axis direction). One sides of the data lines D1 to Dm can be connected to the driving circuit 20. For this reason, the data voltages of the driving circuit 20 can be applied to the data lines D1 to Dm.

The first pad electrodes 210 can be spaced apart from each other at predetermined intervals in the first direction (X-axis direction). For this reason, the first pad electrodes 210 may not overlap the data lines D1 to Dm. Among the first pad electrodes 210, the first pad electrodes 210 disposed on the right edge of the display area DA can be connected to the first floating line FL1 in the non-display area NDA. Among the first pad electrodes 210, the first pad electrodes 210 disposed on the left edge of the display area DA can be connected to the second floating line FL2 in the non-display area NDA.

Each of the second pad electrodes 220 can extend long in the first direction (X-axis direction). For this reason, the second pad electrodes 220 can overlap the data lines D1 to Dm. Also, the second pad electrodes 220 can be connected to the low potential voltage line VSSL in the non-display area NDA. For this reason, the low potential voltage of the low potential voltage line VSSL can be applied to the second pad electrodes 220.

Each of the pixels PX can include a first sub-pixel PX1, a second sub-pixel PX2, and a third sub-pixel PX3. The first sub-pixel PX1, the second sub-pixel PX2, and the third sub-pixel PX3 of each of the pixels PX can be disposed in regions defined in a matrix form by the first pad electrodes 210, the second electrode, and the data lines D1 to Dm. Although FIG. 4 illustrates that the pixel PX includes three sub-pixels, it is not limited thereto, and each of the pixels PX can include four or more sub-pixels.

The first sub-pixel PX1, the second sub-pixel PX2, and the third sub-pixel PX3 of each of the pixels PX can be disposed in the first direction (X-axis direction), but is not limited thereto. That is, the first sub-pixel PX1, the second sub-pixel PX2, and the third sub-pixel PX3 of each of the pixels PX can be disposed in the second direction (Y-axis direction), can be disposed in a zigzag shape, or can be disposed in various other shapes.

The first sub-pixel PX1 emits light of a first color, the second sub-pixel PX2 emits light of a second color, and the third sub-pixel PX3 can emit third color light. The first color light can be red light, the second color light can be green light, and the third color light can be blue light, but are not limited thereto.

In the non-display area NDA of the display panel 10, a pad part PA including data pads DP1 to DPp, floating pads FD1 and FD2, power pads PP1 and PP2, the driving circuit 20, the first floating line FL1, the second floating line FL2, and the low potential voltage line VSSL can be disposed.

The pad part PA including data pads DP1 to DPp, floating pads FD1 and FD2, and power pads PP1 and PP2 can be disposed on one edge of the display panel 10, for example, on the lower edge. The data pads DP1 to DPp, the floating pads FD1 and FD2, and the power pads PP1 and PP2 can be disposed side by side in the first direction (X-axis direction) of the pad part PA.

A circuit board can be attached to the data pads DP1 to DPp, the floating pads FD1 and FD2, and the power pads PP1 and PP2 using an anisotropic conductive film. Accordingly, the circuit board, the data pads DP1 to DPp, the floating pads FD1 and FD2, and the power pads PP1 and PP2 can be electrically connected.

The driving circuit 20 can be connected to the data pads DP1 to DPp through the link lines LL. The driving circuit 20 can receive digital video data DATA and timing signals through the data pads DP1 to DPp. The driving circuit 20 can convert the digital video data DATA into analog data voltages and supply them to the data lines D1 to Dm of the display panel 10.

The low potential voltage line VSSL can be connected to the first power pad PP1 and the second power pad PP2 of the pad part PA. The low potential voltage line VSSL can extend long in the second direction (Y-axis direction) in the non-display area NDA outside the left and right outside of the display area DA. The low potential voltage line VSSL can be connected to the second pad electrode 220. Due to this, the low potential voltage of the power supply circuit 50 can be applied to the second pad electrode 220 through the circuit board, the first power pad PP1, the second power pad PP2, and the low potential voltage line VSSL.

The first floating line FL1 can be connected to the first floating pad FD1 of the pad part PA. The first floating line FL1 can extend long in the second direction (Y-axis direction) in the non-display area NDA outside the left and right sides of the display area DA.

The first floating pad FD1 and the first floating line FL1 can be dummy pads and dummy lines to which no voltage is applied.

The second floating line FL2 can be connected to the second floating pad FD2 of the pad part PA. The first floating line FL1 can extend long in the second direction (Y-axis direction) in the non-display area NDA outside the left and right sides of the display area DA.

The second floating pad FD2 and the second floating line FL2 can be dummy pads and dummy lines to which no voltage is applied.

Meanwhile, since the light emitting devices (300 in FIG. 5) have a very small size, it is very difficult to mount the first sub-pixel PX1, the second sub-pixel PX2, and the third sub-pixel PX3 of the pixels PX.

To solve this problem, an alignment method using a dielectrophoresis method was proposed.

That is, during the manufacturing process, in order to align the light emitting devices 300, an electric field can be formed in each of the first sub-pixel PX1, the second sub-pixel PX2, and the third sub-pixel PX3 of the pixels PX. Specifically, the light emitting devices 300 can be aligned by applying a dielectrophoretic force to the light emitting devices 300 using a dielectrophoresis method during a manufacturing process.

However, it is difficult to apply a ground voltage to the first pad electrodes 210 by driving the thin film transistors during the manufacturing process.

Therefore, in the completed display device, the first pad electrodes 210 are spaced apart at predetermined intervals in the first direction (X-axis direction), but during the manufacturing process, the first pad electrodes 210 may not be disconnected in the first direction (X-axis direction) and can be extended and disposed.

For this reason, during the manufacturing process, the first pad electrodes 210 can be connected to the first floating line FL1 and the second floating line FL2. Therefore, the first pad electrodes 210 can receive a ground voltage through the first floating line FL1 and the second floating line FL2. Therefore, after aligning the light emitting devices 300 using a dielectrophoresis method during the manufacturing process, by disconnecting the first pad electrodes 210, the first pad electrodes 210 can be spaced apart from each other at predetermined intervals in the first direction (X-axis direction).

Meanwhile, the first floating line FL1 and the second floating line FL2 are lines for applying a ground voltage during a manufacturing process, and no voltage can be applied in a completed display device. Alternatively, a ground voltage can be applied to the first floating line FL1 and the second floating line FL2 to prevent static electricity in the finished display device.

FIG. 5 is a plan view showing pixels in the display area of FIG. 4 in detail.

Referring to FIG. 5, the pixel PX can include a first sub-pixel PX1, a second sub-pixel PX2, and a third sub-pixel PX3. The first sub-pixel PX1, the second sub-pixel PX2, and the third sub-pixel PX3 of each of the pixels PX can be arranged in a matrix form in regions defined by an intersection structure of scan lines Sk and data lines Dj, Dj+1, Dj+2, and Dj+3.

The scan lines (Sk) are disposed to extend long in the first direction (X-axis direction). The data lines Dj, Dj+1, Dj+2, and Dj+3 can be disposed to extend in a second direction (Y-axis direction) crossing the first direction (X-axis direction).

Each of the first sub-pixel PX1, the second sub-pixel PX2, and the third sub-pixels PX3 can include a first pad electrode 210, a second pad electrode 220 and a plurality of light emitting devices 300. The first pad electrode 210 and the second pad electrode 220 can be electrically connected to the light emitting devices 300 and can receive voltages so that the light emitting devices 300 emit light.

The first pad electrode 210 of any one of the first sub-pixel PX1, the second sub-pixel PX2, and the third sub-pixel PX3 can be spaced apart from the first pad electrode 210 of an adjacent sub-pixel. For example, the first pad electrode 210 of the first sub-pixel PX1 can be spaced apart from the first pad electrode 210 of the second sub-pixel PX2 adjacent thereto. Also, the first pad electrode 210 of the second sub-pixel PX2 can be spaced apart from the first pad electrode 210 of the third sub-pixel PX3 adjacent thereto. Also, the first pad electrode 210 of the third sub-pixel PX3 can be spaced apart from the first pad electrode 210 of the first sub-pixel PX1 adjacent thereto.

On the other hand, the second pad electrode 220 of any one of the first sub-pixel PX1, the second sub-pixel PX2, and the third sub-pixel PX3 can be connected to the second pad electrode 220 of an adjacent sub-pixel. For example, the second pad electrode 220 of the first sub-pixel PX1 can be connected to the second electrode 210 of the adjacent second sub-pixel PX2. Also, the second pad electrode 220 of the second sub-pixel PX2 can be connected to the second pad electrode 220 of the third sub-pixel PX3 adjacent thereto. Also, the second pad electrode 220 of the third sub-pixel PX3 can be connected to the second pad electrode 220 of the first sub-pixel PX1 adjacent thereto.

In addition, during the manufacturing process, the first pad electrode 210 and the second pad electrode 220 can be used to form an electric field in each of the first sub-pixel PX1, the second sub-pixel PX2, and the third sub-pixel PX3 to align the light emitting device 300. Specifically, the light emitting devices 300 can be aligned by applying a dielectrophoresis force to the light emitting devices 300 using a dielectrophoresis method during the manufacturing process. An electric field is formed by the voltage applied to the first pad electrode 210 and the second pad electrode 220, and a capacitance is formed by the electric field, so that a dielectrophoretic force can be applied to the light emitting device 300.

The first pad electrode 210 can be an anode electrode connected to the second conductive semiconductor layer of the light emitting devices 300, and the second pad electrode 220 can be a cathode electrode connected to the first conductivity-type semiconductor layer of the light emitting devices 300. The first conductivity-type semiconductor layer of the light emitting devices 300 can be an n-type semiconductor layer, and the second conductivity-type semiconductor layer can be a p-type semiconductor layer. However, the present invention is not limited thereto, and the first pad electrode 210 can be a cathode electrode and the second pad electrode 220 can be an anode electrode.

The first pad electrode 210 can include a first electrode stem 210S extending and extending in a first direction (X-axis direction) and at least one first electrode branch portion 210B branched from the first electrode stem portion 210S in a second direction (Y-axis direction). The second pad electrode 220 can include a second electrode stem 220S extending and extending in the first direction (X-axis direction) and at least one second electrode branch portion 220B branched in a second direction (Y-axis direction) from the second electrode stem portion 220S.

The first electrode stem portion 210S can be electrically connected to the thin film transistor 120 through the first electrode contact hole CNTD.

Due to this, the first electrode stem 210S can be applied with a predetermined driving voltage by the thin film transistor 120. The thin film transistor 120 to which the first electrode stem 210S is connected can be the driving transistor DT shown in FIG. 3.

The second electrode stem 220S can be electrically connected to the low potential auxiliary wire 161 through the second electrode contact hole CNTS.

Due to this, the second electrode stem portion 220S can receive the low potential voltage of the low potential auxiliary wire 161. FIG. 5 illustrates that the second electrode stem 220S is connected to the low potential auxiliary wire 161 through the second electrode contact hole CNTS in each of the first sub-pixel PX1, the second sub-pixel PX2 and the third sub-pixels PX3 of the pixel PX, but is not limited to this. For example, the second electrode stem 220S can be connected to the low potential auxiliary wire 161 through the second electrode contact hole CNTS in any one sub-pixel among the first sub-pixel PX1, the second sub-pixel PX2, and the third sub-pixel PX3.

The first electrode stem 210S of one sub-pixel can be disposed parallel to the first electrode stem portion 210S of a neighboring sub-pixel in a first direction (X-axis direction) in a first direction (X-axis direction). For example, the first electrode stem 210S of the first sub-pixel PX1 can be disposed parallel to the first electrode stem 210S of the second sub-pixel PX2 in the first direction (X-axis direction), the first electrode stem 210S of the second sub-pixel PX2 is disposed parallel to the first electrode stem 210S of the third sub-pixel PX3 in a first direction (X-axis direction) and the first electrode stem 210S of the third sub-pixel PX3 can be disposed parallel to the first electrode stem 210S of the first sub-pixel PX1 in the first direction (X-axis direction). This is because the first electrode stems 210S were connected as one during the manufacturing process, and then disconnected through a laser process after the light emitting devices 300 were aligned.

The second electrode branch 220B can be disposed between the first electrode branch 210B. The first electrode branch portions 210B can be symmetrically disposed with respect to the first electrode branch portion 220B. In FIG. 5, each of the first sub-pixel PX1, the second sub-pixel PX2, and the third sub-pixel PX3 of the pixel PX includes two first electrode branch portions 220B, but the present invention is not limited to this. For example, each of the first sub-pixel PX1, the second sub-pixel PX2, and the third sub-pixel PX3 of the pixel PX can include three or more first electrode branches 220B.

Also, FIG. 5 illustrates that each of the first sub-pixel PX1, the second sub-pixel PX2, and the third sub-pixel PX3 of the pixel PX includes one second electrode branch 220B, but the present invention is not limited to this. For example, when each of the first sub-pixel PX1, the second sub-pixel PX2, and the third sub-pixel PX3 of the pixel PX includes a plurality of second electrode branch portions 220B. The first electrode branch 210B can be disposed between the second electrode branch 220B. That is, in each of the first sub-pixel PX1, the second sub-pixel PX2, and the third sub-pixel PX3 of the pixel PX, the first electrode branch 210B, the second electrode branch 220B, the first electrode branch 210B, and the second electrode branch 220B can be sequentially arranged in the first direction (X-axis direction).

The plurality of light emitting devices 300 can be disposed between the first electrode branch 210B and the second electrode branch 220B. One end of at least one light emitting device 300 among the plurality of light emitting devices 300 is disposed to overlap the first electrode branch 210B, and the other end is disposed to overlap the second electrode branch 220B. A second conductivity-type semiconductor layer, which is a p-type semiconductor layer, can be disposed at one end of the plurality of light emitting devices 300, and a first conductivity-type semiconductor layer, which is an n-type semiconductor layer, can be disposed at the other end, but the present invention is not limited to this. For example, a first conductivity-type semiconductor layer, which is an n-type semiconductor layer, can be disposed at one end of the plurality of light emitting devices 300, and a second conductivity-type semiconductor layer, which is a p-type semiconductor layer, can be disposed at the other end.

The plurality of light emitting devices 300 can be disposed substantially parallel to each other in the first direction (X-axis direction). The plurality of light emitting devices 300 can be spaced apart from each other in the second direction (Y-axis direction). In this case, the spacing between the plurality of light emitting devices 300 can be different from each other. For example, some of the plurality of light emitting devices 300 can be adjacently disposed to form one group, and the remaining light emitting devices 300 can be adjacently disposed to form another group.

Connection electrodes 260 can be disposed on the first electrode branch 210B and the second electrode branch 220B, respectively. The connection electrodes 260 can be disposed to extend long in the second direction (Y-axis direction) and spaced apart from each other in the first direction (X-axis direction). The connection electrode 260 can be connected to one end of at least one light emitting device 300 among the light emitting devices 300. The connection electrode 260 can be connected to the first pad electrode 210 or the second pad electrode 220.

The connection electrode 260 can include a first connection electrode 261 disposed on the first electrode branch 210B and connected to one end of at least one of the light emitting devices 300 and a second connection electrode 262 disposed on the second electrode branch 220B and connected to one end of at least one light emitting device 300 of the light emitting devices 300. Due to this, the first connection electrode 261 serves to electrically connect the plurality of light emitting devices 300 to the first pad electrode 210, and the second connection electrode 262 serves to electrically connect the plurality of light emitting devices 300 to the second pad electrode 220.

The width of the first connection electrode 261 in the first direction (X-axis direction) can be greater than the width of the first electrode branch 210B in the first direction (X-axis direction). Also, the width of the second connection electrode 262 in the first direction (X-axis direction) can be greater than the width of the second electrode branch 220B in the first direction (X-axis direction).

For example, each end of the light emitting device 300 is disposed on the first electrode branch 210B of the first pad electrode 210 and the second electrode branch 220B of the second pad electrode 220, but due to the insulating layer (not shown) formed on the first pad electrode 210 and the second pad electrode 220, the light emitting device 300 may not be electrically connected to the first pad electrode 210 and the second pad electrode 220. Accordingly, portions of the side surface and/or top surface of the light emitting device 300 can be electrically connected to the first connection electrode 261 and the second connection electrode 262, respectively.

FIG. 6 is an enlarged view of a first panel area in the display device of FIG. 1.

Referring to FIG. 6, the display device 100 of the embodiment can be manufactured by mechanically and electrically connecting a plurality of panel areas such as the first panel area A1 by tiling.

The first panel area A1 can include a plurality of light emitting devices 150 arranged for each unit pixel (PX in FIG. 2). The light emitting device 150 can be the light emitting device 300 of FIG. 5.

The light emitting device 150 can include, for example, a red light emitting device 150R, a green light emitting device 150G, and a blue light emitting device 150B. For example, the unit pixel PX can include a first sub-pixel PX1, a second sub-pixel PX2, and a third sub-pixel PX3. For example, a plurality of red light emitting devices are disposed in the first sub-pixel PX1, a plurality of green light emitting devices 150G can be disposed in the second sub-pixel PX2, and a plurality of blue light emitting devices 150B can be disposed in the third sub-pixel PX3. The unit pixel PX can further include a fourth sub-pixel in which no light emitting device is disposed, but is not limited thereto.

FIG. 7 is an enlarged view of area A2 of FIG. 6.

Referring to FIG. 7, a display device 100 according to an exemplary embodiment can include a substrate 200, wire electrodes 201 and 202, an insulating layer 206, and a plurality of light emitting devices 150.

The wiring electrode can include a first wiring electrode 201 and a second wiring electrode 202 spaced apart from each other.

The light emitting device 150 can include a red light emitting device 150R, a green light emitting device 150G, and a blue light emitting device 150B0 to form a sub-pixel, but is not limited thereto, and the light emitting device 150 can implement red and green colors by including a red phosphor and a green phosphor, respectively.

The substrate 200 can be formed of glass or polyimide. In addition, the substrate 200 can include a flexible material such as polyethylene naphthalate (PEN) or polyethylene terephthalate (PET). In addition, the substrate 200 can be a transparent material, but is not limited thereto.

The insulating layer 130 can include an insulating and flexible material such as polyimide, PEN, or PET, and can be formed integrally with the substrate 200 to form a single substrate.

The insulating layer 130 can be a conductive adhesive layer having adhesiveness and conductivity, and the conductive adhesive layer can have flexibility and thus enable a flexible function of the display device. For example, the insulating layer 130 can be an anisotropy conductive film (ACF) or a conductive adhesive layer such as an anisotropic conductive medium or a solution containing conductive particles. The conductive adhesive layer can be a layer that is electrically conductive in a direction perpendicular to the thickness but electrically insulating in a direction horizontal to the thickness.

The insulating layer 130 can include an assembly hole 203 into which the light emitting device 150 is inserted. Therefore, during self-assembly, the light emitting device 150 can be easily inserted into the assembly hole 203 of the insulating layer 130.

FIG. 8 is a diagram illustrating an example in which a light emitting device according to an embodiment is assembled to a substrate by a self-assembly method.

Referring to FIG. 8, an example in which the light emitting device 150R according to the embodiment is assembled to the substrate 200 by a self-assembly method using an electromagnetic field will be described.

In FIG. 8, the substrate 200 can be a panel substrate of a display device or a temporary donor substrate for transfer.

In the following description, the substrate 200 will be described as a panel substrate of a display device, but the embodiment is not limited thereto.

The substrate 200 can be formed of glass or polyimide. In addition, the substrate 200 can include a flexible material such as polyethylene naphthalate (PEN) or polyethylene terephthalate (PET). In addition, the substrate 200 can be a transparent material, but is not limited thereto.

Referring to FIG. 8, the light emitting device 150R can be put into a chamber 1300 filled with a fluid 1200. The fluid 1200 can be water such as ultrapure water, but is not limited thereto. A chamber can also be called a water bath, container, vessel, or the like.

Thereafter, the substrate 200 can be disposed on the chamber 1300. Depending on the embodiment, the substrate 200 can be introduced into the chamber 1300.

A pair of first electrodes 211 and a second electrode 212 corresponding to each of the light emitting devices 150R to be assembled can be formed on the substrate 200.

The first electrode 211 and the second electrode 212 can be formed of a transparent electrode (ITO) or can include a metal material having excellent electrical conductivity. For example, the first electrode 211 and the second electrode 212 can include at least one of titanium (Ti), chromium (Cr), nickel (Ni), aluminum (Al), platinum (Pt), gold (Au), tungsten (W), or molybdenum (Mo) or an alloy thereof.

The first electrode 211 and the second electrode 212 can function as a pair of assembly electrodes for fixing the assembled light emitting device 150R to the assembly hole 203 on the substrate 200 by emitting an electric field as voltage is applied thereto.

The distance between the first electrode 211 and the second electrode 212 is smaller than the width of the light emitting device 150R and the width of the assembly hole 203, the assembly position of the light emitting device 150R using an electric field can be more accurately fixed.

An insulating layer 220 is formed on the first electrode 211 and the second electrode 212, the first electrode 211 and the second electrode 212 can be protected from the fluid 1200 and current flowing through the first electrode 211 and the second electrode 212 can be prevented from leaking. The insulating layer 220 can be formed of a single layer or multiple layers of an inorganic insulator such as silica or alumina or an organic insulator.

In addition, the insulating layer 220 can include an insulating and flexible material such as polyimide, PEN, or PET, and can be formed integrally with the substrate 200 to form a single substrate.

The insulating layer 220 can be an adhesive insulating layer or a conductive adhesive layer having conductivity. Since the insulating layer 220 is flexible, it can enable a flexible function of the display device.

A barrier wall 200S can be formed on an upper portion of the insulating layer 220. A partial region of the barrier wall 200S can be located above the first electrode 211 and the second electrode 212.

For example, when the substrate 200 is formed, some of the barrier walls formed on the insulating layer 220 can be removed to form assembly holes 203 in which each of the light emitting devices 150R is assembled to the substrate 200. A second pad electrode 222 can be formed between the barrier wall 200S and the insulating layer 220 to apply power to the light emitting device 150R.

An assembly hole 203 to which the light emitting devices 150R are coupled is formed in the substrate 200, and a surface on which the assembly hole 203 is formed can contact the fluid 1200. The assembly hole 203 can guide an accurate assembly position of the light emitting device 150R.

Meanwhile, the assembly hole 203 can have a shape and size corresponding to the shape of the light emitting device 150R to be assembled at the corresponding position. Accordingly, it is possible to prevent assembling another light emitting device or assembling a plurality of light emitting devices into the assembly hole 203.

Referring back to FIG. 8, after the substrate 200 is disposed, the assembly device 1100 including the magnetic material can move along the substrate 200. As the magnetic material, for example, a magnet or an electromagnet can be used. The assembly device 1100 can move while in contact with the substrate 200 in order to maximize the area of the magnetic field into the fluid 1200. Depending on the embodiment, the assembly device 1100 can include a plurality of magnetic bodies or can include a magnetic body having a size corresponding to that of the substrate 200. In this case, the moving distance of the assembling device 1100 can be limited within a predetermined range. The light emitting device 150R in the chamber 1300 can move toward the assembly device 1100 by the magnetic field generated by the assembly device 1100.

While moving toward the assembly device 1100, the light emitting device 150R can enter the assembly hole 203 and come into contact with the substrate 200.

At this time, by the electric field applied by the first electrode 211 and the second electrode 212 formed on the substrate 200, the light emitting device 150R in contact with the substrate 200 can be prevented from being separated by the movement of the assembly device 1100.

That is, since the time required for assembling each of the light emitting devices to the substrate 200 can be drastically reduced by the above-described self-assembly method using the electromagnetic field, a large-area high-pixel display can be implement more quickly and economically.

A predetermined solder layer 225 is further formed between the light emitting device 150R assembled on the assembly hole 203 of the substrate 200 and the second pad electrode 222 to improve bonding strength of the light emitting device 150R.

Thereafter, the first pad electrode 221 is connected to the light emitting device 150R, and power can be applied.

Next, a molding layer 230 can be formed on the barrier wall 200S of the substrate 200 and the assembly hole 203. The molding layer 230 can be a transparent resin or a resin containing a reflective material or a scattering material.

FIG. 9 shows a state in which a light emitting device is inserted into a substrate by the self-assembly method shown in FIG. 8.

As shown in FIGS. 8 and 9, the light emitting device 150 can be pulled by the magnetic material of the assembly device 1100 and inserted into the assembly hole 203 of the substrate 200.

On the substrate 200, the first wiring electrode 201 and the second wiring electrode 202 can be spaced apart from each other.

An insulating layer 205 can be disposed on the first wire electrode 201 and the second wire electrode 202, and an insulating layer 206 can be disposed on the insulating layer 205. For convenience, each of the insulating layer 2050 and the insulating layer 206 can be referred to as a first insulating layer and a second insulating layer.

The first insulating layer 205 and the second insulating layer 206 can be formed of the same material or different materials, but are not limited thereto. For example, the first insulating layer 205 can be formed of an inorganic material and the second insulating layer 206 can be formed of an organic material, but can be formed conversely.

The second insulating layer 206 can be provided with an assembly hole 203 into which the light emitting device 150 can be inserted. An upper surface of the first insulating layer 205 can be exposed through the assembly hole 203 of the second insulating layer 206.

When the light emitting device 150 is inserted into the assembly hole 203, the lower surface of the light emitting device can come into contact with the upper surface of the first insulating layer 205 exposed through the assembly hole 203.

For example, a voltage can be applied to the first wire electrode 201 and the second wire electrode 202 to form an electric field between the first wire electrode 201 and the second wire electrode 202. The dielectrophoretic force caused by such an electric field can affect the light emitting device 150. That is, the light emitting device 150 inserted into the assembly hole 203 can be fixed to the upper surface of the first insulating layer 205 while maintaining the inserted state in the assembly hole 203 by the dielectrophoretic force formed between the first wire electrode 201 and the second wire electrode 202.

Although not shown, in a subsequent process, an insulating layer can be formed in the space of the assembly hole 203 not occupied by the light emitting device 150, and then the first pad electrode (210 in FIG. 5) and the second pad electrode 220 can be formed. In addition, a first connection electrode 261 can be formed to connect the first electrode of the light emitting device 150 to the first pad electrode 210 and a second connection electrode 262 can be formed to connect the second electrode of the light emitting device 150 to the second pad electrode 220. Accordingly, when a voltage is applied to the first pad electrode (210 in FIG. 5) and the second pad electrode 220, the light emitting device 150 can emit light.

Meanwhile, in the display device according to the embodiment, a light emitting device is used as a light source. The light emitting device of the embodiment is a self-emitting device that emits light by itself when electricity is applied, and can be a semiconductor light emitting device. Since the light emitting device of the embodiment is made of an inorganic semiconductor material, it is resistant to deterioration and has a semi-permanent lifespan, so it can contribute to realizing high-quality and high-definition images in a display device by providing stable light.

FIG. 10 is a schematic cross-sectional view of the display panel of FIG. 2.

Referring to FIG. 10, the display panel 10 of the embodiment can include a first substrate 40, a light emitting unit 41, a color generating unit 42, and a second substrate 46. The display panel 10 of the embodiment can include more components than these, but is not limited thereto. The first substrate 40 can be the substrate 200 shown in FIG. 7.

Although not shown, at least one insulating layer can be disposed between the first substrate 40 and the light emitting part 41, between the light emitting unit 41 and the color generator 42 and/or between the color generator 42 and the second substrate 46, but is not limited thereto.

The first substrate 40 can support the light emitting unit 41, the color generating unit 42, and the second substrate 46. Various elements as described above can be formed on the second substrate 46. For example, data lines D1 to Dm (m is an integer of 2 or greater), scan lines (S1 to Sn), a high potential voltage line (VDDL) and a low potential voltage line (VSSL) as shown in FIG. 2, as shown in FIG. 3, a plurality of transistors and at least one capacitor, and as shown in FIG. 4, the first pad electrode 210 and the second pad electrode 220

The first substrate 40 can be formed of glass, but is not limited thereto.

The light emitting unit 41 can provide light to the color generating unit 42. The light emitting unit 41 can include a plurality of light sources that emit light themselves by applying electricity. For example, the light source can include a light emitting device (300 in FIG. 5, 150 in FIGS. 6, 11, and 12).

For example, the plurality of light emitting devices 150 can be separately disposed for each sub-pixel of a pixel and independently emit light by controlling each sub-pixel.

As another example, the plurality of light emitting devices 150 can be arranged regardless of pixel division and simultaneously emit light from all sub-pixels.

The light emitting device 150 of the embodiment can emit blue light, but is not limited thereto. For example, the light emitting device 150 of the embodiment can emit white light or purple light.

The color generating unit 42 can generate light of a different color from the light provided by the light emitting unit 41.

For example, the color generator 42 can include a first color generator 43, a second color generator 44, and a third color generator 45. The first color generator 43 can correspond to the first sub-pixel PX1 of the pixel, the second color generator 44 can correspond to the second sub-pixel PX2 of the pixel, and the third color generator 45 can correspond to the third sub-pixel PX3 of the pixel.

The first color generating unit 43 can generate first color light based on the light provided from the light emitting unit 41, the second color generating unit 44 can generate second color light based on the light provided from the light emitting unit 41, and the third color generating unit 45 can generate third color light based on the light provided from the light emitting unit 41. For example, the first color generating unit 43 outputs blue light from the light emitting unit 41 as red light, the second color generator 44 outputs blue light from the light emitting unit 41 as green light, and the third color generator 45 outputs blue light from the light emitting unit 41 as it is.

For example, the first color generator 43 includes a first color filter, and the second color generator 44 can include a second color filter, and the third color generator 45 can include a third color filter.

The first color filter, the second color filter, and the third color filter can be formed of a transparent material through which light can pass.

For example, at least one of the first color filter, the second color filter, and the third color filter can include a quantum dot.

The quantum dot of the embodiment can be selected from a group II-IV compound, a group IV-VI compound, a group IV element, a group IV compound, and a combination thereof.

The II-VI compound can be selected from the group consisting of a binary compound selected from the group consisting of CdSe, CdTe, ZnS, ZnSe, ZnTe, ZnO, HgS, HgSe, HgTe, MgSe, MgS and mixtures thereof, a three-element compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof and quaternary compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

The III-V compound can be selected from the group consisting of a binary compound selected from the group consisting of GaN, GaP, GaAs, GaSb, AlN, AlP, AlAs, AlSb, InN, InP, InAs, InSb and mixtures thereof, a three-element compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP and mixtures thereof and quaternary compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The IV-VI compound can be selected from the group consisting of a binary compound selected from the group consisting of SnS, SnSe, SnTe, PbS, PbSe, PbTe and mixtures thereof, a three-element compound selected from the group consisting of SnSeS, SnSeTe, SnSTe, PbSeS, PbSeTe, PbSTe, SnPbS, SnPbSe, SnPbTe and mixtures thereof and quaternary compounds selected from the group consisting of SnPbSSe, SnPbSeTe, SnPbSTe and mixtures thereof.

Group IV elements can be selected from the group consisting of Si, Ge, and mixtures thereof. The group IV compound can be a binary element compound selected from the group consisting of SiC, SiGe, and mixtures thereof.

These quantum dots can have a full width of half maximum (FWHM) of an emission wavelength spectrum of about 45 nm or less, and light emitted through the quantum dots can be emitted in all directions. Accordingly, the viewing angle of the light emitting display device can be improved.

On the other hand, quantum dots can have the form of spherical, pyramidal, multi-arm, or cubic nanoparticles, nanotubes, nanowires, nanofibers, nanoplatelet particles, etc. but, is not limited to this.

For example, when the light emitting device 150 emits blue light, the first color filter can include red quantum dots, and the second color filter can include green quantum dots. The third color filter may not include quantum dots, but is not limited thereto. For example, blue light from the light emitting device 150 is absorbed by the first color filter, and the absorbed blue light is wavelength-shifted by red quantum dots to output red light. For example, blue light from the light emitting device 150 is absorbed by the second color filter, and the wavelength of the absorbed blue light is shifted by green quantum dots to output green light. For example, blue light from a foot and an element can be absorbed by the third color filter, and the absorbed blue light can be emitted as it is.

Meanwhile, when the light emitting device 150 emits white light, not only the first color filter and the second color filter, but also the third color filter can include quantum dots. That is, the wavelength of white light of the light emitting device 150 can be shifted to blue light by the quantum dots included in the third color filter.

For example, at least one of the first color filter, the second color filter, and the third color filter can include a phosphor. For example, some of the first color filters, the second color filters, and the third color filters can include quantum dots, and others can include phosphors. For example, each of the first color filter and the second color filter can include a phosphor and a quantum dot. For example, at least one of the first color filter, the second color filter, and the third color filter can include scattering particles. Since blue light incident on each of the first color filter, the second color filter, and the third color filter is scattered by the scattering particles and the color of the scattered blue light is shifted by the corresponding quantum dots, light output efficiency can be improved.

As another example, the first color generator 43 can include a first color conversion layer and a first color filter. The second color generator 44 can include a second color converter and a second color filter. The third color generator 45 can include a third color conversion layer and a third color filter. Each of the first color conversion layer, the second color conversion layer, and the third color conversion layer can be disposed adjacent to the light emitting unit 41. The first color filter, the second color filter and the third color filter can be disposed adjacent to the second substrate 46.

For example, the first color filter can be disposed between the first color conversion layer and the second substrate 46. For example, the second color filter can be disposed between the second color conversion layer and the second substrate 46. For example, the third color filter can be disposed between the third color conversion layer and the second substrate 46.

For example, the first color filter can contact the upper surface of the first color conversion layer and have the same size as the first color conversion layer, but is not limited thereto. For example, the second color filter can contact the upper surface of the second color conversion layer and have the same size as the second color conversion layer, but is not limited thereto. For example, the third color filter can contact the upper surface of the third color conversion layer and have the same size as the third color conversion layer, but is not limited thereto.

For example, the first color conversion layer can include red quantum dots, and the second color conversion layer can include green quantum dots. The third color conversion layer may not include quantum dots. For example, the first color filter can include a red-based material that selectively transmits the red light converted in the first color conversion layer, the second color filter can include a green-based material that selectively transmits the green light converted in the second color conversion layer, and the third color filter can include a blue-based material that selectively transmits blue light transmitted through the third color conversion layer as it is.

Meanwhile, when the light emitting device 150 emits white light, not only the first color conversion layer and the second color conversion layer, but also the third color conversion layer can include quantum dots. That is, the wavelength of white light of the light emitting device 150 can be shifted to blue light by the quantum dots included in the third color filter.

Referring back to FIG. 10, the second substrate 46 can be disposed on the color generator 42 to protect the color generator 42. The second substrate 46 can be formed of glass, but is not limited thereto.

The second substrate 46 can be called a cover window, a cover glass, or the like.

The second substrate 46 can be formed of glass, but is not limited thereto.

Meanwhile, the embodiment provides a light emitting device that can be easily self-assembled on a substrate and a display device including the light emitting device.

The embodiment provides a light emitting device with improved self-assembly speed and a display device including the same.

The embodiment provides a light emitting device with improved luminous efficiency and a display device including the same.

Hereinafter, various embodiments for achieving this problem will be described.

FIG. 11 is a plan view showing a light emitting device according to an embodiment, and FIG. 12 is a cross-sectional view showing a light emitting device according to an embodiment.

Referring to FIGS. 11 and 12, the light emitting device 150 according to the embodiment can include a first conductivity-type semiconductor layer 171, an active layer 172, a second conductivity-type semiconductor layer 173, a first electrode 180 and a second electrode 190. The light emitting device 150 can be the light emitting device 300 of FIG. 5 or the light emitting device 150 of FIG. 6.

The light emitting device 150 according to the embodiment can be a horizontal light emitting device, but is not limited thereto. The light emitting device 150 according to the embodiment can be one of a red light emitting device (150R in FIG. 6), a green light emitting device 150G, and a blue light emitting device 150B, but is not limited thereto.

For example, the first conductivity-type semiconductor layer 171, the active layer 172, and the second conductivity-type semiconductor layer 173 can be grown on the substrate 160. Although the substrate 160 is shown in FIG. 12, the substrate 160 can be omitted. The substrate 160 can be a sapphire substrate or a semiconductor substrate, but is not limited thereto.

The first conductivity-type semiconductor layer 171 can be provided as a compound semiconductor. The first conductivity-type semiconductor layer 171 can be provided as, for example, a Group 2-6 compound semiconductor or a Group 3-5 compound semiconductor. For example, the first conductivity-type semiconductor layer 171 can be doped with an n-type dopant such as Si, Ge, Sn, Se, or Te.

The active layer 172 can generate light of a wavelength band corresponding to a combination of first carriers (eg, electrons) provided from the first conductivity-type semiconductor layer 171 and second carriers (eg, holes) provided from the second conductivity-type semiconductor layer 173. The active layer 172 can have any one or more of a single well structure, a multi-well structure, a quantum dot structure, or a quantum wire structure. The active layer 172 can be provided as a compound semiconductor. The active layer 172 can be provided with, for example, a Group 2-6 or Group 3-5 compound semiconductor. When the active layer 172 is provided in a multi-well structure, the active layer 172 can be provided by stacking a plurality of barrier layers and a plurality of well layers.

The second conductivity-type semiconductor layer 173 can be provided as a compound semiconductor. The second conductivity-type semiconductor layer 173 can be provided as, for example, a Group 2-6 compound semiconductor or a Group 3-5 compound semiconductor. For example, the second conductivity-type semiconductor layer 173 can be doped with a p-type dopant such as Mg, Zn, Ca, Sr, or Ba.

When the first conductivity-type semiconductor layer 171, the active layer 172, and the second conductivity-type semiconductor layer 173 are grown, part of the second conductivity-type semiconductor layer 173, the active layer 172, and the first conductivity-type semiconductor layer 171 can be removed by mesa etching. For example, as shown in FIGS. 11 and 12, the second conductivity-type semiconductor layer 173 and the active layer 172 corresponding to the peripheral area excluding the central area of the light emitting device 150 according to the embodiment are removed, and an upper portion of the first conductivity-type semiconductor layer 171 can be removed. A peripheral region can surround the central region.

As an example, mesa etching can be performed using a photoresist pattern. That is, a mesa structure can be obtained by forming a protective pattern in the central region of the light emitting device 150 according to the embodiment and performing mesa etching using the protective pattern as a mask.

As another example, mesa etching can be performed using the second electrode 190. That is, a mesa structure can be obtained by forming the second electrode 190 in the central region of the light emitting device 150 according to the embodiment and performing mesa etching using the second electrode 190 as a mask. After the first conductivity-type semiconductor layer 171, the active layer 172 and the second conductivity-type semiconductor layer 173 are grown, a second electrode 190 can be formed in the central region of the light emitting device 150 according to the embodiment. In this case, each of the mesa-etched second conductivity-type semiconductor layer 173, the active layer 172, and the first conductivity-type semiconductor layer 171 can have the same size as the second electrode 190.

A first electrode can be formed on the top surface of the first conductivity-type semiconductor layer 171 exposed by mesa etching, and a second electrode 190 can be formed on the top surface of the second conductivity-type semiconductor layer 173.

Each of the first electrode 180 and the second electrode 190 can include a plurality of layers, but is not limited thereto.

The second electrode 190 can include a transparent conductive material. For example, the second electrode 190 can include a conductive material such as ITO, ZnO, GZO, or IGZO. When the second electrode 190 is formed on the second conductivity-type semiconductor layer 173 using such a conductive material, a current spreading effect is generated in which current spreads along the surface of the second electrode 190, so that a current can flow from the entire area of the second electrode 190 to the second conductivity-type semiconductor layer 173, and uniform light emission can be possible in the entire area of the active layer 172.

Meanwhile, the light emitting device 150 according to the embodiment can include a diffusion layer 195.

The diffusion layer 195 can be disposed between the first electrode 180 and the first conductivity-type semiconductor layer 171. For example, the diffusion layer 195 can be formed inside the first conductivity-type semiconductor layer 171. For example, the diffusion layer 195 can be formed inside the first conductivity-type semiconductor layer 171 corresponding to the first electrode 180. For example, the top surface of the diffusion layer 195 and the top surface of the first conductivity-type semiconductor layer 171 can be positioned on the same horizontal line. For example, the lower surface of the diffusion layer 195 can be positioned lower than the upper surface of the first conductivity-type semiconductor layer 171. For example, a recess can be formed in a region corresponding to the first electrode 180 on the upper surface of the first conductivity-type semiconductor layer 171, and the diffusion layer 195 can be disposed in the recess.

The diffusion layer 195 can be an ohmic contact layer and can improve the ohmic contact characteristics between the first electrode 180 and the first conductivity-type semiconductor layer 171, current can more easily flow from the first conductivity-type semiconductor layer 171 to the first electrode 180.

In particular, when the light emitting device 150 according to the embodiment is a red light emitting device, since the ohmic characteristics between the first conductivity-type semiconductor layer 171 and the first electrode 180 are not good, and current does not flow smoothly between the first electrode 180 and the first conductivity-type semiconductor layer 171, light emitting efficiency can decrease. Therefore, when the light emitting device 150 according to the embodiment is a red light emitting device, a diffusion layer 195 can be provided. When the light emitting device 150 according to the embodiment is a green light emitting device or a blue light emitting device, the diffusion layer 195 can or may not be provided.

For example, as shown in FIG. 13, one layer 181 of a plurality of layers in the first electrode 180 can include a magnetic material. Although Ni can be used as the magnetic material, it is not limited thereto. In the light emitting device 150 according to the embodiment, by forming one layer 181 of the first electrode 180 with a magnetic material, as shown in FIG. 8, when the self-assembly process is performed, when the assembly device 1100 including the magnetic material moves along the substrate 200, a magnetic material included in the first electrode 180 of the light emitting device 150 according to the embodiment accommodated in the chamber 1300 can be magnetized. Accordingly, the light emitting device 150 according to the embodiment can be inserted into the assembly hole 203 of the substrate (200 in FIG. 8). Therefore, as the assembly device 1100 moves, the light emitting device 150 according to the embodiment can be quickly and accurately inserted into the assembly hole 203 of the substrate 200, so that the self-assembly speed can be dramatically improved.

Meanwhile, the diffusion layer 195 can be formed by a heat treatment process. When the heat treatment process is performed, some materials of the first electrode 180 and some materials of the first conductivity-type semiconductor layer 171 react at the boundary between the first electrode 180 and the second conductivity-type semiconductor layer 173, a diffusion layer 195 can be formed.

Some materials of the first electrode 180 can be Ni. Accordingly, Ni, which is a part of the material of the first electrode 180, can be diffused by the heat treatment process to form the diffusion layer 195. For example, the diffusion layer 195 can include Ni, Ga, an oxide material, or the like.

The diffusion layer 195 of the embodiment can be defined as a region including Ni. That is, Ni can be dispersed over the entire area of the diffusion layer 195. The concentration of Ni dispersed in the diffusion layer 195 can vary along the thickness direction of the diffusion layer 195, that is, in the vertical direction.

For example, the concentration of Ni dispersed in the diffusion layer 195 can decrease toward the inside in a vertical direction from the upper surface of the first conductivity-type semiconductor layer 171 in contact with the first electrode 180.

For example, the concentration of Ni dispersed in the diffusion layer 195 can be different along the horizontal direction. This can be due to the fact that the diffusion rate of Ni dispersed in the diffusion layer 195 is different according to the material concentration of each region of the first conductivity-type semiconductor layer 171. Ni is a material with excellent diffusivity by heat. Therefore, during the heat treatment process, most of the Ni contained in the first electrode 180 is diffused into the diffusion layer 195, so the amount of Ni remaining in the first electrode 180 can be very small.

As most of the Ni of the first electrode 180 is diffused into the diffusion layer 195, as shown in FIG. 13, when the thickness t of the diffusion layer 195 is increased, there is an advantage of excellent ohmic characteristics.

However, if most of the Ni of the first electrode 180 is diffused into the diffusion layer 195 and the amount of Ni remaining in the first electrode 180 is small, the amount magnetized by the magnetic material included in the assembly device 1100 is also small, the light emitting device 150 according to the embodiment may not be moved to the substrate (200 in FIG. 8) by the magnetic material and may not be inserted into the assembly hole 203 of the substrate 200.

The embodiment can suggest a method for improving the self-assembly speed while improving the ohmic characteristics.

To this end, the thickness t of the diffusion layer 195 can be 100 nm or less. Even when the thickness t of the diffusion layer 195 is 100 nm or less, ohmic characteristics can be improved. In addition, when the thickness t of the diffusion layer 195 is 100 nm or less, it can mean that the amount of Ni in a specific layer of the first electrode 180 is controlled to diffuse relatively less into the diffusion layer 195. In this way, by changing the structural mechanism of the first electrode 180 such that the thickness t of the diffusion layer 195 is 100 nm or less, the self-assembly speed can be improved by securing the amount of Ni in a specific layer of the first electrode 180.

For example, the thickness t of the diffusion layer 195 can be 40 nm to 100 nm. For example, when the thickness t of the diffusion layer 195 is less than 40 nm, the thickness t of the diffusion layer 195 is thin or the diffusion layer 195 is not properly formed, resulting in poor ohmic characteristics. Accordingly, current may not flow smoothly from the first conductivity-type semiconductor layer 171 to the first electrode 180. When the thickness t of the diffusion layer 195 exceeds 100 nm, the area of the first conductivity-type semiconductor layer 171 can decrease as the thickness t of the diffusion layer 195 increases. Accordingly, the number of electrons in the first conductivity-type semiconductor layer 171 can decrease, and thus luminous efficiency can decrease.

The structure of the first electrode 180 will be described later in detail.

On the other hand, as shown in FIG. 11, the first electrode 180 is located in the central region of the light emitting device 150 according to the embodiment, and the first electrode 180 can surround the second electrode 190. The light emitting device 150 according to the embodiment can include a central region and a peripheral region surrounding the central region. For example, the central region can be a region not etched by mesa etching, and the peripheral region can be a region removed by mesa etching. In this case, the first electrode 180 is disposed on the first conductivity-type semiconductor layer 171 located in the peripheral area, and the second electrode 190 can be disposed on the second conductivity-type semiconductor layer 173 located in the central region. As described above, in the light emitting device 150 according to the embodiment, since the peripheral area except for the central area is removed by mesa etching, the second electrode 190 can surround the first electrode 180.

Although the first electrode 180 is illustrated in FIG. 11 as being disposed on a partial region of the upper surface of the first conductivity-type semiconductor layer 171, but the first electrode 180 can be disposed on the entire area of the upper surface of the first conductivity-type semiconductor layer 171. In FIG. 12, the second electrode 190 is shown as being disposed on a partial region of the upper surface of the second conductivity-type semiconductor layer 173, but the second electrode 190 can be disposed on the entire upper surface of the second conductivity-type semiconductor layer 173.

For example, the first electrode 180 can have a closed loop shape surrounding the second electrode 190. For example, the second electrode 190 can have a circular shape when viewed from above. As the first electrode 180 has a loop shape, a current can uniformly flow from the second electrode 190 to the first electrode 180 along a radial direction via the second conductivity-type semiconductor layer 173, the active layer 172, and the first conductivity-type semiconductor layer 171. Accordingly, since electrons in the entire region of the first conductivity-type semiconductor layer 171 are injected into the active layer 172 and contribute to light emission, light emitting efficiency can be improved.

Since the first electrode 180 has a closed loop structure, the diffusion layer 195 placed under the first electrode 180 can also have a closed loop structure corresponding to the first electrode 180. Accordingly, current can flow smoothly from the first conductivity-type semiconductor layer 171 through the first electrode 180 by the diffusion layer 195 having a closed loop structure.

As shown in FIG. 12, the light emitting device 150 according to the embodiment can have a circular shape, but is not limited thereto. For example, the second conductivity-type semiconductor layer 173 can have a circular shape when viewed from above. For example, the active layer 172 can have a circular shape when viewed from above. For example, the first conductivity-type semiconductor layer 171 can have a circular shape when viewed from above.

Hereinafter, various structures of the first electrode 180 of the embodiment will be described in detail.

First Example

FIG. 14 shows a first example of the second electrode of the embodiment.

Referring to FIG. 14, the first electrode 180A of the embodiment can include a first layer 181 and a second layer 182. Each of the first layer 181 and the second layer 182 can include a metal.

For example, the first layer 181 can be disposed on the first conductivity-type semiconductor layer 171, and the second layer 182 can be disposed on the first layer 181. For example, the first layer 181 and the second layer 182 can have the same size.

For example, the first layer 181 can be an assembly inducing layer. That is, the first layer 181 can include a magnetic material. Therefore, as shown in FIG. 8, when the assembly device 1100 including the magnetic material moves along the substrate (200 in FIG. 8), the magnetic material of the first electrode 180 is magnetized by the magnetic material. Therefore, since the light emitting device 150 according to the embodiment including the first electrode 180 is inserted into the assembly hole 203 of the substrate 200, the self-assembly speed can be improved. For example, the first layer 181 can include Ni.

The second layer 182 is a bonding layer and can include Ti. The second layer 182 can improve bonding with another electrode material.

Although not shown, a bonding layer for bonding with an external electrode, for example, a pad electrode (220 in FIG. 5) can be disposed on the second layer 182.

A diffusion layer 195 can be formed in the first conductivity-type semiconductor layer 171 corresponding to the first electrode 180 by diffusion of Ni included in the first layer 181 into the first conductivity-type semiconductor layer 171. In this case, since the amount of Ni included in the first layer 181 is reduced, the thickness of the first layer 181 can also be reduced. Considering this, the thickness of the first layer 181 can be set.

For example, the first layer 181 can have a thickness of 150 nm to 200 nm. When the thickness of the first layer 181 is less than 150 nm, since the thickness of the first layer 181 is thin, the first layer 181 is not magnetized by the assembly device 1100 during self-assembly. The light emitting device 150 according to the embodiment including the first electrode 180 may not be pulled to the substrate (200 in FIG. 8) and may not be inserted into the assembly hole 203 of the substrate. When the thickness of the first layer 181 is greater than 200 nm, the thickness of the first electrode 180 becomes thick, and light emitted from the active layer 172 is prevented from traveling due to the opaque metal of the first electrode 180, which can reduce light emitting efficiency. For example, the first layer 181 can have a thickness of approximately 180 nm.

Second Example

FIG. 15 shows a second example of the second electrode of the embodiment.

Referring to FIG. 15, the first electrode 180B of the embodiment can include a first layer 181, a second layer 182, a third layer 183, and a fourth layer 184. Each of the first layer 181, the second layer 182, the third layer 183, and the fourth layer 184 can include a metal.

The second layer 182 can be disposed on the first layer 181. The third layer 183 can be disposed below the first layer 181.

The fourth layer 184 can be disposed below the third layer 183. For example, the fourth layer 184 can be disposed below the first layer 181 with the third layer 183 interposed therebetween. For example, the fourth layer 184 can be more adjacent to the first conductivity-type semiconductor layer 171 than the first layer 181. For example, the fourth layer 184 can be disposed on the first conductivity-type semiconductor layer 171, and the first layer 181 can be disposed on the fourth layer 184.

For example, the third layer 183 can include the same material as the first layer 181. For example, the first layer 181 and the third layer 183 can include Ti.

For example, the fourth layer 184 can include the same material as the first layer 181. The first layer 181 and the fourth layer 184 can include Ni.

For example, the first layer 181 can be an assembly contribution layer, and the fourth layer 184 can be a diffusion contribution layer. Therefore, when the heat treatment process is performed, Ni of the fourth layer 184 is diffused into the first conductivity-type semiconductor layer 171, so that a diffusion layer 195 can be formed inside the first conductivity-type semiconductor layer 171 corresponding to the first electrode 180. At this time, the diffusion layer 195 is an ohmic contact layer, and can allow current to flow smoothly from the first conductivity-type semiconductor layer 171 to the first electrode 180.

Meanwhile, Ni of the first layer 181 may not diffuse into the first conductivity-type semiconductor layer 171 due to the third layer 183. In this case, since the Ni of the first layer 181 is not diffused into the first conductivity-type semiconductor layer 171 and is intact, during self-assembly, Ni of the first layer 181 can be magnetized by a magnetic material included in the assembly device (1100 in FIG. 8). Accordingly, the light emitting device 150 according to the embodiment can be easily inserted into the assembly hole 203 of the substrate 200.

Alternatively, a portion of Ni of the first layer 181 can diffuse into the first conductivity-type semiconductor layer 171. In this case, Ni included in the diffusion layer 195 can be mainly diffused in the fourth layer 184 rather than in the first layer 181.

As an example, the thickness t11 of the first layer 181 can be greater than the thickness t12 of the fourth layer 184. Since the first layer 181 is an assembly-inducing layer used for self-assembly, the amount of Ni should be large for easier magnetization, so the thickness t12 of the fourth layer 184 can be greater. The fourth layer 184 can be a diffusion contributing layer for forming the diffusion layer 195. Therefore, since the fourth layer 184 requires a relatively small amount of Ni to form the diffusion layer 195 having a very thin thickness, for example, 100 nm or less, so that the fourth layer can have a thickness t12 smaller than the thickness t11 of the first layer 181.

As another example, before the heat treatment process, the fourth layer 184 can have the same thickness as the first layer 181. Thereafter, Ni of the fourth layer 184 is diffused into the first conductivity-type semiconductor layer 171 by a heat treatment process, as the thickness of the fourth layer 184 is reduced, a fourth layer 184 having a thickness t12 smaller than the thickness t11 of the first layer 181 can be finally formed as shown in FIG. 15.

As shown in FIG. 15, the first layer 181 can have a thickness t11 of 150 nm to 200 nm. When the thickness t11 of the first layer 181 is less than 150 nm, since the thickness t11 of the first layer 181 is thin, the first layer 181 is not magnetized by the assembly device 1100 during self-assembly. The light emitting device 150 according to the embodiment including the first electrode 180 may not be inserted into the assembly hole 203 of the substrate because it is not pulled to the substrate (200 in FIG. 8). When the thickness t11 of the first layer 181 is greater than 200 nm, the thickness of the first electrode 180 becomes thick, and the light emitted from the active layer 172 is prevented from traveling due to the opaque metal material of the first electrode 180, and thus the luminous efficiency can decrease. For example, the first layer 181 can have a thickness t11 of about 180 nm.

The fourth layer 184 can have a thickness t12 of 10 nm to 50 nm. When the thickness t12 of the fourth layer 184 is less than 10 nm, since the amount of Ni included in the fourth layer 184 is small, the diffusion layer 195 formed by diffusion of Ni in the fourth layer 184 is thin (t in FIG. 13) or the diffusion layer 195 is not properly formed. Accordingly, current may not flow smoothly from the first conductivity-type semiconductor layer 171 to the first electrode 180 due to poor ohmic characteristics. When the thickness t12 of the fourth layer 184 is greater than 50 nm, the amount of Ni in the fourth layer 184 is large and continues to contribute to the formation of the diffusion layer 195 so that the thickness t of the diffusion layer 195 can be greater than a desired thickness, that is, 100 nm. As the thickness of the diffusion layer 195 increases, the area of the first conductivity-type semiconductor layer 171 decreases, and accordingly, the number of electrons in the first conductivity-type semiconductor layer 171 decreases, and thus the luminous efficiency can decrease.

Third Example

FIG. 16 shows a third example of the second electrode of the embodiment.

Referring to FIG. 16, the first electrode 180C of the embodiment can include a first layer 181, a second layer 182, a third layer 183, a fourth layer 184, a fifth layer 185, and a sixth layer 186. Each of the first layer 181, the second layer 182, the third layer 183, the fourth layer 184, the fifth layer 185, and the sixth layer 186 can include metal.

Since the first layer 181, the second layer 182, the third layer 183, and the fourth layer 184 have been described in the second example (FIG. 15) of the first electrode 180B of the embodiment, omit the description.

The first layer 181, the second layer 182, the third layer 183, and the fourth layer 184 not described in the third example of the first electrode 180C of the embodiment can be easily understood from the second example (FIG. 15) of the first electrode 180B of the embodiment.

The fifth layer 185 can be disposed below the fourth layer 184, and the sixth layer 186 can be disposed below the fifth layer 185.

The fifth layer 185 can be a diffusion suppressing layer. The fifth layer 185 can suppress, mitigate, or hinder rapid diffusion of Ni of the fourth layer 184 into the first conductivity-type semiconductor layer 171 during the heat treatment process. During the heat treatment process, Ni of the fourth layer 184 should pass through the fifth layer 185 to diffuse into the first conductivity-type semiconductor layer 171.

For example, part of the Ni of the fourth layer 184 is blocked by the fifth layer 185 and is not diffused into the first conductivity-type semiconductor layer 171, and another part of the Ni of the fourth layer 184 is diffused into the first conductivity-type semiconductor layer 171 via the fifth layer 185 to form a diffusion layer 195 having a desired thickness (less than 100 nm). Accordingly, the fifth layer 185 can partially or selectively allow the Ni of the fourth layer 184 to pass through, thereby controlling the amount of diffusion.

For this, the fifth layer 185 should have an optimal thickness. For example, the fifth layer 185 can have a thickness of 5 nm to 10 nm.

When the thickness of the fifth layer 185 is less than 5 nm, the thickness of the diffusion layer 195 can exceed a desired thickness (less than 100 nm) because the diffusion of Ni included in the fourth layer 184 is not properly suppressed due to the thin thickness. When the thickness of the fifth layer 185 is greater than 10 nm, since Ni included in the fourth layer 184 is too thick to pass through the fifth layer, the diffusion layer 195 may not be properly formed or can be less than the minimum thickness of the diffusion layer 195, for example, 40 nm.

Meanwhile, the fifth layer 185 can be an electrode layer. The fifth layer 185 can be formed of a metal having excellent electrical conductivity. For example, the fifth layer 185 can include Au, but is not limited thereto. The fifth layer 185 can serve as an actual electrode of the first electrode 180.

The sixth layer 186 can be disposed below the fifth layer 185. For example, the sixth layer 186 can be disposed below the fourth layer 184 with the fifth layer 185 interposed therebetween. For example, the sixth layer 186 can be more adjacent to the first conductivity-type semiconductor layer 171 than the fifth layer 185. For example, a sixth layer 186 can be disposed on the first conductivity-type semiconductor layer 171, and a fifth layer 185 can be disposed on the sixth layer 186.

The sixth layer 186 can facilitate contact with the first conductivity-type semiconductor layer 171. For example, the sixth layer 186 can be AuGe, but is not limited thereto.

When the 6th layer is provided, Ni of the fourth layer 184 can selectively pass through not only the fifth layer but also the sixth layer and be diffused into the first conductivity-type semiconductor layer 171 to form the diffusion layer 195.

Meanwhile, the shape of the diffusion layer 195 can be different depending on the thickness of the diffusion layer 195. The shape of the diffusion layer will be described with reference to FIGS. 17 and 18.

FIG. 17 is an image showing a first example of the second electrode and the diffusion layer.

In FIG. 17, a diffusion layer 195 having a thickness of 45 nm to 50 nm is shown. It can be seen that the diffusion layer 195 is formed inside the first conductivity-type semiconductor layer 171. Ni included in the first and/or fourth layers 184 is diffused from the upper surface of the first conductivity-type semiconductor layer 171 to the inside of the first conductivity-type semiconductor layer 171, and a region in which Ni is diffused can be defined as the diffusion layer 195. In this case, the lower surface of the diffusion layer 195 can have a non-uniform surface.

FIG. 18 is an image showing a second example of the second electrode and the diffusion layer.

In FIG. 18, a diffusion layer 195 with a thickness of approximately 67 nm is shown. A diffusion layer 195 can be formed inside the first conductivity-type semiconductor layer 171. In this case, the lower surface of the diffusion layer 195 can have an island shape. That is, a plurality of diffusion layers 195 corresponding to a plurality of regions of the first conductivity-type semiconductor layer 171 can be formed. For example, a plurality of diffusion layers 195 can contact each other in a horizontal direction. For example, a plurality of diffusion layers 195 can be spaced apart from each other in a horizontal direction. For example, some of the plurality of diffusion layers 195 can be in contact with each other in a horizontal direction, and other parts of the plurality of diffusion layers 195 can be spaced apart from each other. For example, the plurality of diffusion layers 195 can have a concave-convex shape in a downward direction.

Meanwhile, when the diffusion layer is formed to a desired thickness (100 nm or less) in the embodiment, the self-assembly speed can be remarkably improved. Referring to FIG. 19, technical effects according to the embodiment will be described.

FIG. 19 shows the self-assembly speed according to the thickness of the diffusion layer.

As shown in FIGS. 12 and 19, it can be seen that the self-assembly speed is different depending on the thickness of the diffusion layer 195. For example, when the thickness of the diffusion layer 195 is 55 nm (Example 1), the self-assembly speed can be 1,000 µm/s. For example, when the thickness of the diffusion layer 195 is 100 nm (Example 2), the self-assembly speed can be 450 µm/s. For example, when the thickness of the diffusion layer 195 is 200 nm (comparative example), the self-assembly speed can be 90 µm/s.

It can be seen that the self-assembly speed of the first embodiment and the second embodiment is improved compared to the comparison. Specifically, the self-assembly speed of the second embodiment can be 5 times or more faster than that of the comparative example, and the self-assembly speed of the first embodiment can be about 11 times or more faster than the self-assembly speed of the comparative example.

Therefore, according to the embodiment, the ohmic characteristics of the diffusion layer 195 are improved by changing the electrode structure mechanism such that the depth of the diffusion layer 195 is 100 µm or less. Meanwhile, when self-assembly using a magnetic material, the self-assembly speed is drastically improved to prevent luminance defects and to secure high luminance.

Meanwhile, the aforementioned light emitting device 150 can be a lateral light emitting device, a flip chip type light emitting device, or a vertical light emitting device.

In the case of a vertical light emitting device, the first electrode can be disposed on a lower surface of the first conductivity-type semiconductor layer. In this case, a diffusion layer can be formed on the first conductivity-type semiconductor layer in contact with the first electrode. The detailed structure of the first electrode and the diffusion layer can be the same as those of the above-described embodiment.

For example, the vertical light emitting device can have a size of 5 µm to 50 µm when viewed from above. For example, the vertical light emitting device can have a size of 5 µm to 30 µm when viewed from above.

The above detailed description should not be construed as limiting in all respects and should be considered as illustrative. The scope of the embodiments should be determined by reasonable interpretation of the appended claims, and all changes within the equivalent range of the embodiments are included in the scope of the embodiments.

INDUSTRIAL APPLICABILITY

The embodiment can be applied to a small-sized light emitting device capable of securing high luminance by arranging as many units as possible in a unit pixel in order to implement a display. For example, the light emitting device includes a cylindrical light emitting device, a disk light emitting device, a micro light emitting device, a nano light emitting device, and a rod light emitting device, but is not limited thereto.

The embodiment can be adopted in the display field for displaying images or information.

The invention claimed is:

1. A light emitting device comprising:
a first conductivity-type semiconductor layer;
an active layer on the first conductivity-type semiconductor layer;
a second conductivity-type semiconductor layer on the active layer;
a first electrode on the first conductivity-type semiconductor layer;
a second electrode on the second conductivity-type semiconductor layer; and
a diffusion layer between the first electrode and the first conductivity-type semiconductor layer,
wherein the first electrode comprises a plurality of layers,
wherein at least one layer of the plurality of layers comprises a magnetic material,
wherein the diffusion layer comprises the magnetic material, and
wherein a thickness of the diffusion layer is 40 nm to 100 nm.

2. The light emitting device according to claim 1, wherein the diffusion layer comprises an ohmic contact layer.

3. The light emitting device according to claim 1, wherein the magnetic material comprises Ni.

4. The light emitting device according to claim 3, wherein the first electrode comprises a first layer comprising the Ni, and a second layer disposed on the first layer and comprising Ti.

5. The light emitting device according to claim 4, wherein the first layer comprises an assembly inducing layer.

6. The light emitting device according to claim 4, wherein the first electrode comprises a third layer disposed below the first layer and containing the Ti and a fourth layer disposed below the third layer and comprising the Ni.

7. The light emitting device according to claim 6, wherein the fourth layer comprises a diffusion contributing layer.

8. The light emitting device according to claim 6, wherein a thickness of the first layer is greater than that of the fourth layer.

9. The light emitting device according to claim 8, wherein the thickness of the first layer is 150 nm to 200 nm, and the thickness of the fourth layer is 10 nm to 50 nm.

10. The light emitting device according to claim 6, wherein the first electrode comprises a fifth layer disposed below the fourth layer and comprising Au and a sixth layer disposed below the fifth layer and comprising AuGe.

11. The light emitting device according to claim 10, wherein the fifth layer comprises a diffusion suppressing layer.

12. The light emitting device according to claim 10, wherein the fifth layer comprises an electrode layer.

13. The light emitting device according to claim 10, wherein the fifth layer has a thickness of 5 nm to 10 nm.

14. The light emitting device according to claim 1, wherein the diffusion layer has an island shape.

15. The light emitting device according to claim 1, wherein a lower surface of the diffusion layer has a non-uniform surface.

16. The light emitting device according to claim 1, wherein the diffusion layer is formed inside the first conductivity-type semiconductor layer.

17. The light emitting device according to claim 1, wherein the second electrode is located in a central region of the light emitting device and the first electrode surrounds the second electrode.

18. The light emitting device according to claim 1, wherein the light emitting device has a circular shape.

19. A display device comprising:
- a substrate;
- a first wire electrode and a second wire electrode on the substrate;
- a partition layer having a plurality of assembly holes and on the first and second wire electrodes; and
- a light emitting device disposed in each of the plurality of assembly holes,
wherein the light emitting device comprises:
- a first conductivity-type semiconductor layer;
- an active layer on the first conductivity-type semiconductor layer;
- a second conductivity-type semiconductor layer on the active layer;
- a first electrode on the first conductivity-type semiconductor layer;
- a second electrode on the second conductivity-type semiconductor layer; and
- a diffusion layer between the first electrode and the first conductivity-type semiconductor layer,
wherein the first electrode comprises a plurality of layers,
wherein at least one layer of the plurality of layers comprises a magnetic material,
wherein the diffusion layer comprises the magnetic material, and
wherein a thickness of the diffusion layer is 40 nm to 100 nm.

\* \* \* \* \*